United States Patent
Liu et al.

(10) Patent No.: US 12,171,098 B2
(45) Date of Patent: Dec. 17, 2024

(54) THREE-DIMENSIONAL MEMORY DEVICE WITH IMPROVED CHARGE LATERAL MIGRATION AND METHOD FOR FORMING THE SAME

(71) Applicant: YANGTZE MEMORY TECHNOLOGIES CO., LTD., Wuhan (CN)

(72) Inventors: Xiaoxin Liu, Wuhan (CN); Lei Xue, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 478 days.

(21) Appl. No.: 17/488,879

(22) Filed: Sep. 29, 2021

(65) Prior Publication Data

US 2022/0123016 A1    Apr. 21, 2022

Related U.S. Application Data

(63) Continuation of application No. PCT/CN2021/115782, filed on Aug. 31, 2021.

(30) Foreign Application Priority Data

Oct. 19, 2020   (CN) .......................... 202011120882.7
Jun. 7, 2021    (CN) .......................... 202110628570.5

(51) Int. Cl.
```
H10B 43/27      (2023.01)
H01L 21/28      (2006.01)
H01L 29/423     (2006.01)
```

(52) U.S. Cl.
CPC ........ H10B 43/27 (2023.02); H01L 29/40117 (2019.08); H01L 29/4234 (2013.01)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS 9,847,342 B2 *  12/2017  Nagashima ............ H10B 41/10
9,991,277 B1 *   6/2018  Tsutsumi ............. H01L 29/0847
(Continued)

FOREIGN PATENT DOCUMENTS

CN    107768378 A    3/2018
CN    109417076 A    3/2019
(Continued)

OTHER PUBLICATIONS

International Search Report issued in corresponding International Application No. PCT/CN2021/115807, mailed Oct. 27, 2021, 4 pages.
(Continued)

*Primary Examiner* — Didarul A Mazumder
*Assistant Examiner* — Gustavo G Ramallo
(74) *Attorney, Agent, or Firm* — BAYES PLLC

(57) ABSTRACT

A three-dimensional (3D) memory device includes a stack structure and a channel structure. The stack structure includes interleaved conductive layers and dielectric layers. The channel structure extends through the stack structure along a first direction. The channel structure includes a semiconductor channel, and a memory film over the semiconductor channel. The memory film includes a tunneling layer over the semiconductor channel, a storage layer over the tunneling layer, and a blocking layer over the storage layer. The blocking layer and the storage layer are separated by the dielectric layers into a plurality of sections.

19 Claims, 24 Drawing Sheets

(58) Field of Classification Search
CPC ........ H10B 53/50; H10B 41/00; H10B 41/10;
H10B 41/20; H10B 41/23; H10B 41/27;
H10B 41/30; H10B 41/35; H10B
41/40–44; H10B 41/46–50; H10B 41/60;
H10B 41/70; H10B 43/00; H10B 43/10;
H10B 43/20; H10B 43/23; H10B 43/27;
H10B 43/30; H10B 43/35; H10B 43/40;
H10B 43/50; H10B 51/00; H10B 51/10;
H10B 51/20; H10B 51/30; H10B 51/40;
H10B 51/50
See application file for complete search history.

(56) References Cited

U.S. PATENT DOCUMENTS

| | | | |
|---|---|---|---|
| 2009/0242966 A1* | 10/2009 | Son | H01L 29/4234 257/324 |
| 2010/0163968 A1* | 7/2010 | Kim | H10B 43/27 257/E21.423 |
| 2011/0147823 A1* | 6/2011 | Kuk | H10B 43/20 257/E21.41 |
| 2012/0184078 A1 | 7/2012 | Kiyotoshi | |
| 2016/0043093 A1 | 2/2016 | Lee et al. | |
| 2018/0053774 A1* | 2/2018 | Sakamoto | H10B 43/35 |
| 2019/0148405 A1 | 5/2019 | Shin | |

FOREIGN PATENT DOCUMENTS

| | | |
|---|---|---|
| CN | 109817634 A | 5/2019 |
| CN | 112259549 A | 1/2021 |

OTHER PUBLICATIONS

International Search Report issued in corresponding International Application No. PCT/CN2021/115782, mailed Nov. 25, 2021, 4 pages.

* cited by examiner

THREE-DIMENSIONAL MEMORY DEVICE WITH IMPROVED CHARGE LATERAL MIGRATION AND METHOD FOR FORMING THE SAME

CROSS-REFERENCE TO RELATED APPLICATIONS

This application is a continuation of International Application No. PCT/CN2021/115782, filed on Aug. 31, 2021, entitled "THREE-DIMENSIONAL MEMORY DEVICE AND METHOD FOR FORMING THE SAME," which claims the benefit of priorities to Chinese Patent Application No. 202110628570.5 filed on Jun. 7, 2021, and Chinese Patent Application No. 202011120882.7 filed on Oct. 19, 2020, all of which are incorporated herein by reference in their entireties. This application is also related to U.S. application Ser. No. 17/488,915, filed on Sep. 29, 2021, entitled "THREE-DIMENSIONAL MEMORY DEVICE AND METHOD FOR FORMING THE SAME," which is hereby incorporated by reference in its entirety.

BACKGROUND

The present disclosure relates to memory devices and methods for forming memory devices.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A three-dimensional (3D) semiconductor device architecture can address the density limitation in some planar semiconductor devices, for example, Flash memory devices.

SUMMARY

In one aspect, a 3D memory device is disclosed. The 3D memory device includes a stack structure and a channel structure. The stack structure includes interleaved conductive layers and dielectric layers. The channel structure extends through the stack structure along a first direction. The channel structure includes a semiconductor channel, and a memory film over the semiconductor channel. The memory film includes a tunneling layer over the semiconductor channel, a storage layer over the tunneling layer, and a blocking layer over the storage layer. The storage layer is separated by the dielectric layers into a plurality of sections.

In another aspect, a 3D memory device is disclosed. The 3D memory device includes a stack structure and a channel structure. The stack structure includes interleaved conductive layers and dielectric layers. The channel structure extends through the stack structure along a first direction. The channel structure includes a semiconductor channel, and a memory film over the semiconductor channel. The memory film includes a tunneling layer over the semiconductor channel, a storage layer over the tunneling layer, and a blocking layer over the storage layer. The storage layer is separated by the dielectric layers into a plurality of sections. The storage layer and the dielectric layers are separated by the tunneling layer.

In still another aspect, a system is disclosed. The system includes a 3D memory device configured to store data and a memory controller. The 3D memory device includes a stack structure and a channel structure. The stack structure includes interleaved conductive layers and dielectric layers. The channel structure extends through the stack structure along a first direction. The channel structure includes a semiconductor channel, and a memory film over the semiconductor channel. The memory film includes a tunneling layer over the semiconductor channel, a storage layer over the tunneling layer, and a blocking layer over the storage layer. The storage layer is separated by the dielectric layers into a plurality of sections. The memory controller is coupled to the 3D memory device and is configured to control operations of the 3D memory device.

In yet another aspect, a system is disclosed. The system includes a 3D memory device configured to store data and a memory controller. The 3D memory device includes a stack structure and a channel structure. The stack structure includes interleaved conductive layers and dielectric layers. The channel structure extends through the stack structure along a first direction. The channel structure includes a semiconductor channel, and a memory film over the semiconductor channel. The memory film includes a tunneling layer over the semiconductor channel, a storage layer over the tunneling layer, and a blocking layer over the storage layer. The storage layer is separated by the dielectric layers into a plurality of sections. The storage layer and the dielectric layers are separated by the tunneling layer. The memory controller is coupled to the 3D memory device and is configured to control operations of the 3D memory device.

In yet another aspect, a method for forming a 3D memory device is disclosed. A stack structure of a plurality of first dielectric layers and a plurality of second dielectric layers alternatingly arranged is formed. A channel hole is formed in the stack structure along a first direction. The sidewalls of the channel hole include a recess in the plurality of first dielectric layers. A blocking layer is formed on the recess of the channel hole in the plurality of first dielectric layers. A storage layer is formed over the blocking layer on the recess of the channel hole in the plurality of first dielectric layers. The storage layer in each first dielectric layer is separated by the second dielectric layers. A tunneling layer is formed over at least the storage layer on the sidewalls of the channel hole. A semiconductor channel is formed over the tunneling layer.

In yet another aspect, a method for forming a 3D memory device is disclosed. A stack structure of a plurality of first dielectric layers and a plurality of second dielectric layers alternatingly arranged is formed. A channel hole is formed in the stack structure along a first direction. The sidewalls of the channel hole include a recess in the plurality of first dielectric layers. A blocking layer is conformally formed on the recess of the channel hole covering the plurality of second dielectric layers and the recess in the plurality of first dielectric layers. A storage layer is formed over the blocking layer. A thinning operation is performed to remove a portion of the storage layer and a portion of the blocking layer to expose the plurality of second dielectric layers. The storage layer in each first dielectric layer is separated by the second dielectric layers. A tunneling layer is formed over the sidewalls of the channel hole. A semiconductor channel is formed over the tunneling layer.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1:
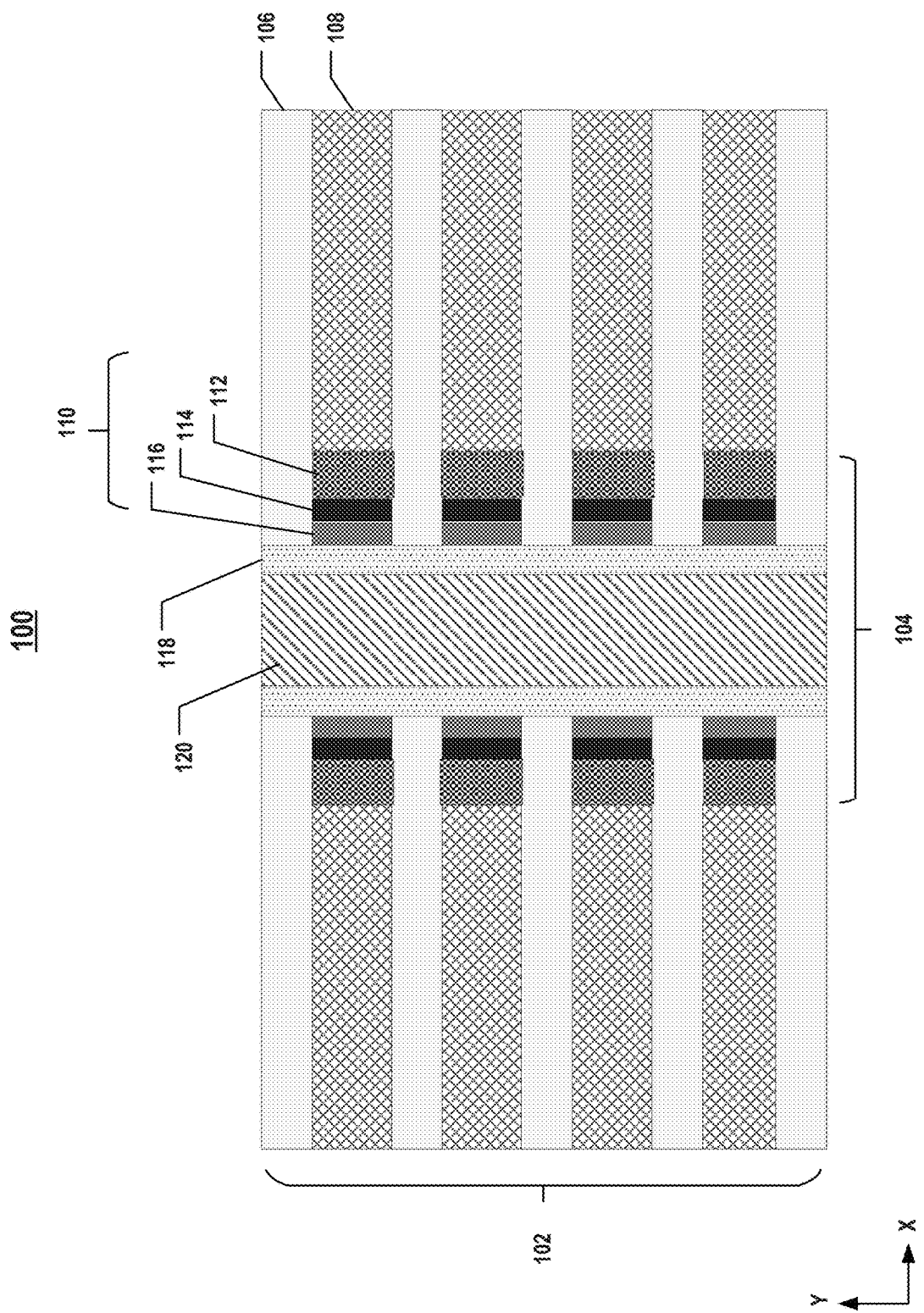
FIG. 1 illustrates a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

A 3D semiconductor device can be formed by stacking semiconductor wafers or dies and interconnecting them vertically so that the resulting structure acts as a single device to achieve performance improvements at reduced power and a smaller footprint than conventional planar processes. However, the charge lateral migration issue becomes a major issue of the 3D semiconductor device. In some 3D memory devices, such as 3D NAND memory devices, a stack of devices includes memory array devices and peripheral devices. As the shrinkage of the device size and thickness, the distance between the word lines becomes smaller and smaller. Hence, the charge lateral migration issue in the channel structure is one of the bottlenecks of the 3D NAND memory devices.

FIG. 1 illustrates a cross-section of an exemplary 3D memory device 100, according to some aspects of the present disclosure. 3D memory device 100 includes a stack structure 102 and a channel structure 104. Stack structure 102 includes a plurality of interleaved conductive layers 108 and dielectric layers 106, and the stacked conductive/dielectric layer pairs are also referred to as a memory stack. In some implementations, dielectric layers 106 may include dielectric materials including, but not limited to, silicon oxide, silicon nitride, silicon oxynitride, or any combination thereof. In some implementations, conductive layers 108 may form the word lines and may include conductive materials including, but not limited to, tungsten (W), cobalt (Co), copper (Cu), aluminum (Al), polysilicon, doped silicon, silicides, or any combination thereof.

As shown in FIG. 1, channel structure 104 extends through stack structure 102 along the y-direction. Channel structure 104 may include a semiconductor channel 118, and a memory film 110 formed over semiconductor channel 118. In some implementations, channel structure 104 may also include a dielectric core 120 in the center of channel structure 104. In some implementations, memory film 110 may include a tunneling layer 116 over semiconductor channel 118, a storage layer 114 over tunneling layer 116, and a blocking layer 112 over storage layer 114. The meaning of "over" here, besides the explanation stated above, should be also interpreted "over" something from the top side or from the lateral side.

In some implementations, tunneling layer 116 may include silicon oxide, silicon oxynitride, or any combination thereof. In some implementations, storage layer 114 may include silicon nitride, silicon oxynitride, silicon, or any combination thereof. In some implementations, blocking layer 112 may include silicon oxide, silicon oxynitride, high dielectric constant (high-k) dielectrics, or any combination thereof.

In some implementations, each word line, e.g., conductive layers 108, in the memory stack, e.g., stack structure 102, functions as a gate conductor of memory cells in NAND memory string, e.g., channel structure 104. In some embodiments, each word line (conductive layer 108) may include the gate conductor made from tungsten, an adhesion layer including titanium/titanium nitride (Ti/TiN) or tantalum/tantalum nitride (Ta/TaN), and a gate dielectric layer made from high-k dielectric materials. The word lines may extend laterally coupling a plurality of memory cells.

As shown in FIG. 1, blocking layer 112, storage layer 114, and tunneling layer 116 of memory film 110 are divided by dielectric layers 106 into a plurality of sections. In other words, memory film 110 of 3D memory device 100 is an inconsecutive structure, and blocking layer 112, storage layer 114, and tunneling layer 116 are fully divided by dielectric layers 106 into several isolated sections. In addition, semiconductor channel 118 of 3D memory device 100 is in contact with dielectric layers 106. In some implementations, semiconductor channel 118 of 3D memory device 100 is in contact with tunneling layer 116 and dielectric layers 106. In some implementations, tunneling layer 116 is in contact with storage layer 114, semiconductor channel 118, and dielectric layers 106. In some implementations, storage layer 114 may include a plurality of trap layers. In some implementations, storage layer 114 may include a first trap layer and a second trap layer arranged along the x-direction. In some implementations, the first trap layer is in direct contact with blocking layer 112 and is an inconsecutive structure separated by dielectric layers 106. In some implementations, the second trap layer is in direct contact with the first trap layer and may protect the first trap layer in later processes. In some implementations, the second trap layer is an inconsecutive structure separated by dielectric layers 106. In some implementations, the second trap layer is a consecutive structure and may be partially separated by dielectric layers 106. In some implementations, tunneling layer 116 may be formed over the second trap layer. In some implementations, the second trap layer may function as a tunneling layer, and the formation of tunneling layer 116 may be omitted.

By dividing blocking layer 112, storage layer 114, and tunneling layer 116 into a plurality of isolated sections along the y-direction, partials of memory film 110 are divided into several inconsecutive sections. The charge stored in storage layer 114 is isolated from other storage layers 114 corresponding to different word lines. In other words, the charge stored in storage layer 114 corresponding to different word lines is isolated from each other. Hence, the charge migration may be restrained in 3D memory device 100.

Figure 2:
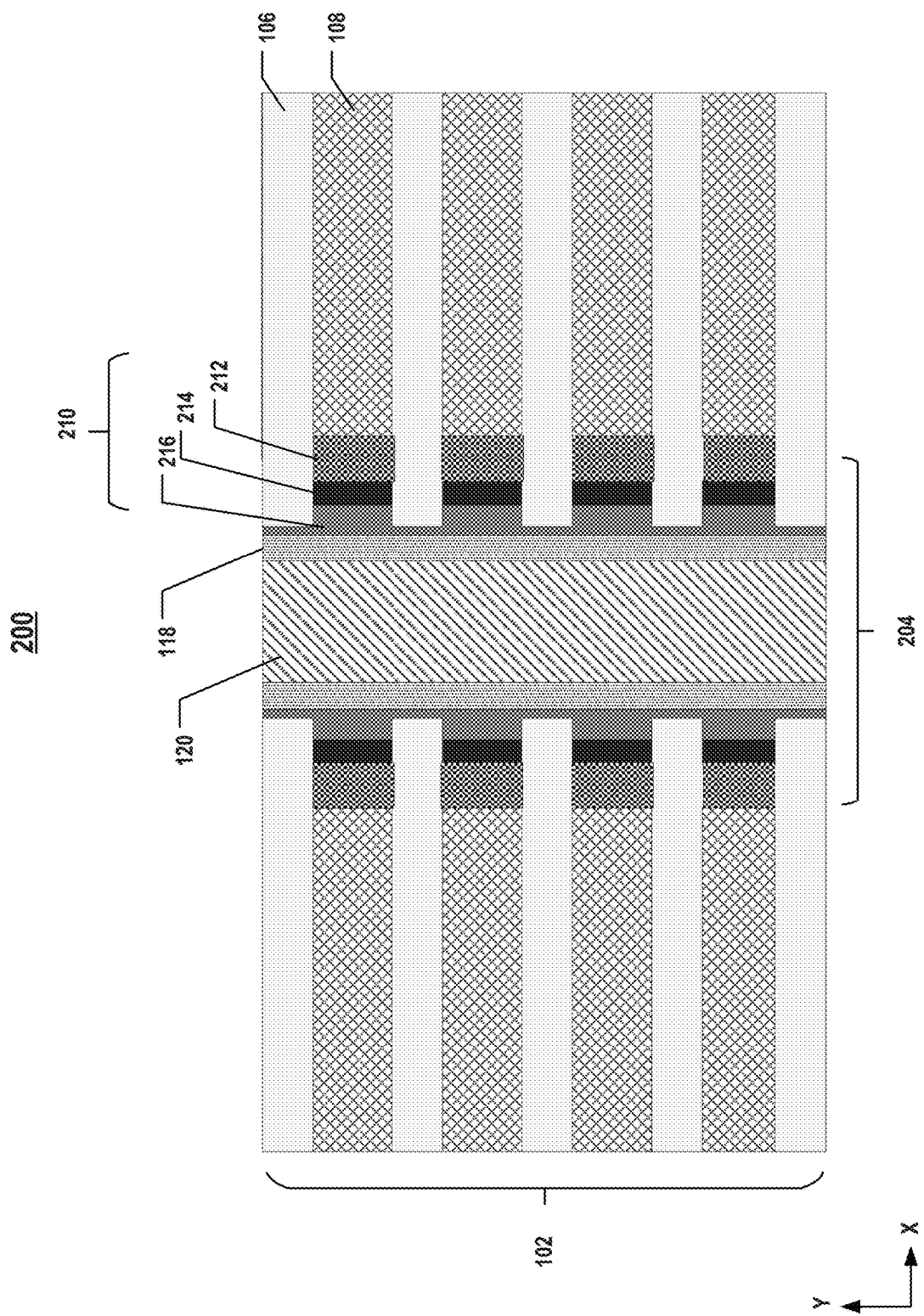
FIG. 2 illustrates a cross-section of another exemplary 3D memory device, according to some aspects of the present disclosure.

FIG. 2 illustrates a cross-section of another exemplary 3D memory device 200, according to some aspects of the present disclosure. 3D memory device 200 includes stack structure 102 and a channel structure 204. In some implementations, stack structure 102 of 3D memory device 200 may be similar to stack structure 102 of 3D memory device 100. Channel structure 204 extends through stack structure 102 along the y-direction. Channel structure 204 may include semiconductor channel 118, and a memory film 210 formed over semiconductor channel 118. In some implementations, channel structure 204 may also include dielectric core 120 in the center of channel structure 204. In some implementations, semiconductor channel 118 and dielectric core 120 of 3D memory device 200 may be similar to semiconductor channel 118 and dielectric core 120 of 3D memory device 100.

In some implementations, memory film 210 may include a tunneling layer 216 over semiconductor channel 118, a storage layer 214 over tunneling layer 216, and a blocking layer 212 over storage layer 214. In some implementations, tunneling layer 216 may include silicon oxide, silicon oxynitride, or any combination thereof. In some implementations, storage layer 214 may include silicon nitride, silicon oxynitride, silicon, or any combination thereof. In some implementations, blocking layer 212 may include silicon oxide, silicon oxynitride, high dielectric constant (high-k) dielectrics, or any combination thereof.

As shown in FIG. 2, tunneling layer 216 may include a first portion disposed between two adjacent dielectric layers 106 and in contact with storage layer 214. Tunneling layer 216 may further include a second portion physically extended along y-direction across several dielectric layers 106. The first portion and the second portion of tunneling layer 216 are in direct contact with each other. In other words, the first portion and the second portion of tunneling layer 216 are physically connected. In some implementations, the first portion and the second portion of tunneling layer 216 may be formed in the same deposition operation. In some implementations, the first portion and the second portion of tunneling layer 216 may be formed in different deposition operations. In other words, tunneling layer 216 is not fully inconsecutive along y-direction, and only blocking layer 212 and storage layer 214 are fully divided by dielectric layers 106 into a plurality of isolated sections. In some implementations, semiconductor channel 118 and dielectric layers 106 are separated by the second portion of tunneling layer 216. In some implementations, tunneling layer 216 is in contact with dielectric layers 106. In some implementations, storage layer 214 may include a plurality of trap layers. In some implementations, storage layer 214 may include a first trap layer and a second trap layer arranged along the x-direction. In some implementations, the first trap layer is in direct contact with blocking layer 212 and is an inconsecutive structure separated by dielectric layers 106. In some implementations, the second trap layer is in direct contact with the first trap layer and may protect the first trap layer in later processes. In some implementations, the second trap layer is an inconsecutive structure separated by dielectric layers 106. In some implementations, the second trap layer is a consecutive structure and may be partially separated by dielectric layers 106. In some implementations, tunneling layer 216 may be formed over the second trap layer. In some implementations, the second trap layer may function as a tunneling layer, and the formation of tunneling layer 216 may be omitted.

By dividing blocking layer 212 and storage layer 214 into a plurality of isolated sections along the y-direction, partials of memory film 210 are divided into several inconsecutive sections. The charge stored in storage layer 214 is isolated from other storage layer 214 corresponding to different word lines. In other words, the charge stored in storage layer 214 corresponding to different word lines is isolated from each other. Hence, the charge migration may be restrained in 3D memory device 200.

Figure 3:
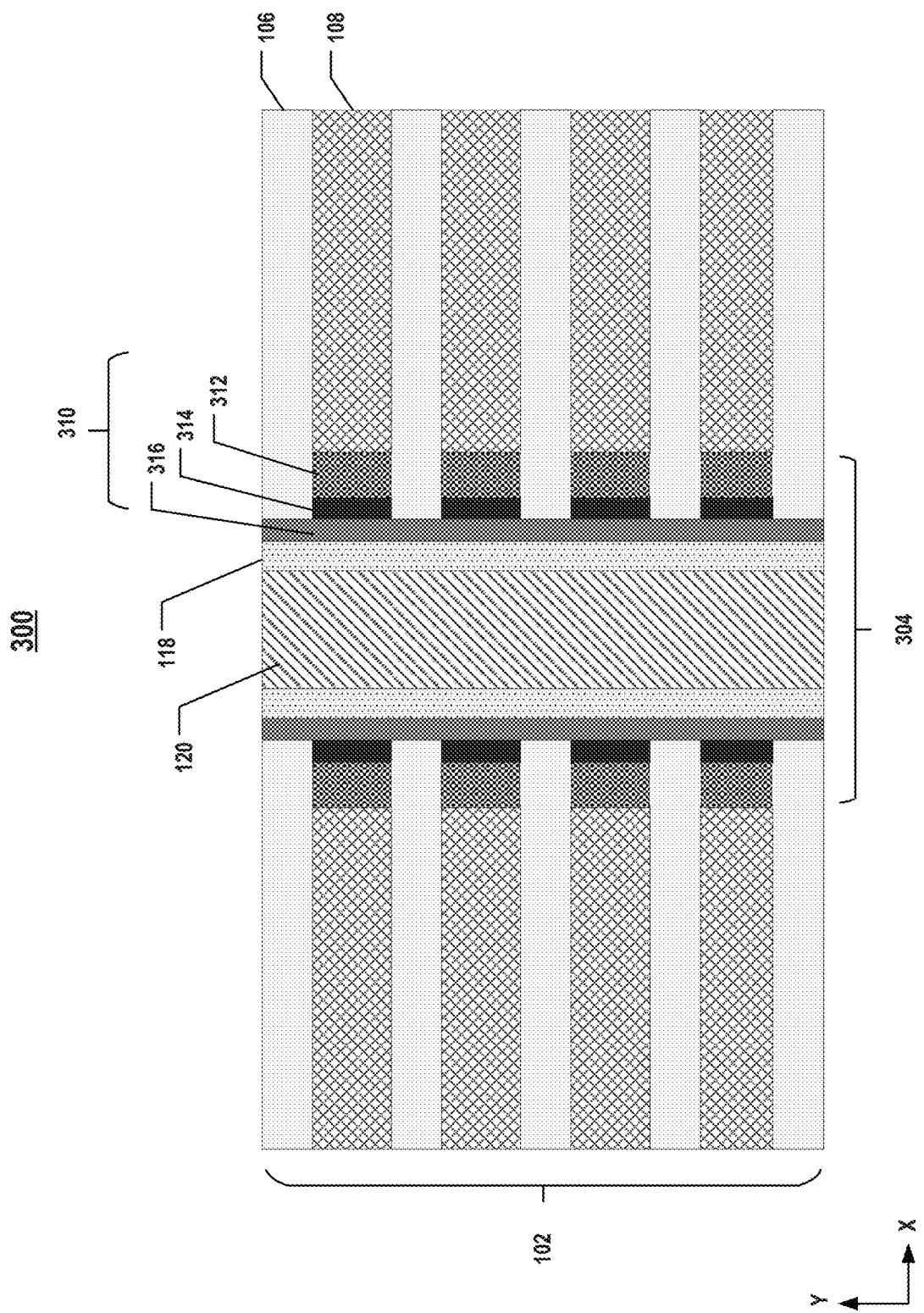
FIG. 3 illustrates a cross-section of still another exemplary 3D memory device, according to some aspects of the present disclosure.

FIG. 3 illustrates a cross-section of still another exemplary 3D memory device 300, according to some aspects of the present disclosure. 3D memory device 300 includes stack structure 102 and a channel structure 304. In some implementations, stack structure 102 of 3D memory device 300 may be similar to stack structure 102 of 3D memory device 100 or 200. Channel structure 304 extends through stack structure 102 along the y-direction. Channel structure 304 may include semiconductor channel 118, and a memory film 310 formed over semiconductor channel 118. In some implementations, channel structure 304 may also include dielectric core 120 in the center of channel structure 304. In some implementations, semiconductor channel 118 and dielectric core 120 of 3D memory device 300 may be similar to semiconductor channel 118 and dielectric core 120 of 3D memory device 100 or 200.

In some implementations, memory film 310 may include a tunneling layer 316 over semiconductor channel 118, a storage layer 314 over tunneling layer 316, and a blocking layer 312 over storage layer 314. In some implementations, tunneling layer 316 may include silicon oxide, silicon oxynitride, or any combination thereof. In some implementations, storage layer 314 may include silicon nitride, silicon oxynitride, silicon, or any combination thereof. In some implementations, blocking layer 312 may include silicon oxide, silicon oxynitride, high dielectric constant (high-k) dielectrics, or any combination thereof.

As shown in FIG. 3, tunneling layer 316 may be disposed along y-direction parallel to semiconductor channel 118. In other words, in some implementations, only blocking layer 312 and storage layer 314 are fully divided by dielectric layers 106 into a plurality of isolated sections. In some implementations, semiconductor channel 118 and dielectric layers 106 are separated by tunneling layer 316. In some implementations, tunneling layer 316 is in contact with dielectric layers 106. In some implementations, storage layer 314 may include a plurality of trap layers. In some implementations, storage layer 314 may include a first trap layer and a second trap layer arranged along the x-direction. In some implementations, the first trap layer is in direct contact with blocking layer 312 and is an inconsecutive structure separated by dielectric layers 106. In some implementations, the second trap layer is in direct contact with the first trap layer and may protect the first trap layer in later processes. In some implementations, the second trap layer is an inconsecutive structure separated by dielectric layers 106. In some implementations, the second trap layer is a consecutive structure and may be partially separated by dielectric layers 106. In some implementations, tunneling layer 316 may be formed over the second trap layer. In some implementations, the second trap layer may function as a tunneling layer, and the formation of tunneling layer 316 may be omitted.

By dividing blocking layer 312 and storage layer 314 into a plurality of isolated sections along the y-direction, partials of memory film 310 are divided into several inconsecutive sections. The charge stored in storage layer 314 is isolated from other storage layer 314 corresponding to different word lines. In other words, the charge stored in storage layer 314 corresponding to different word lines is isolated from each other. Hence, the charge migration may be restrained in 3D memory device 300.

Figure 4:
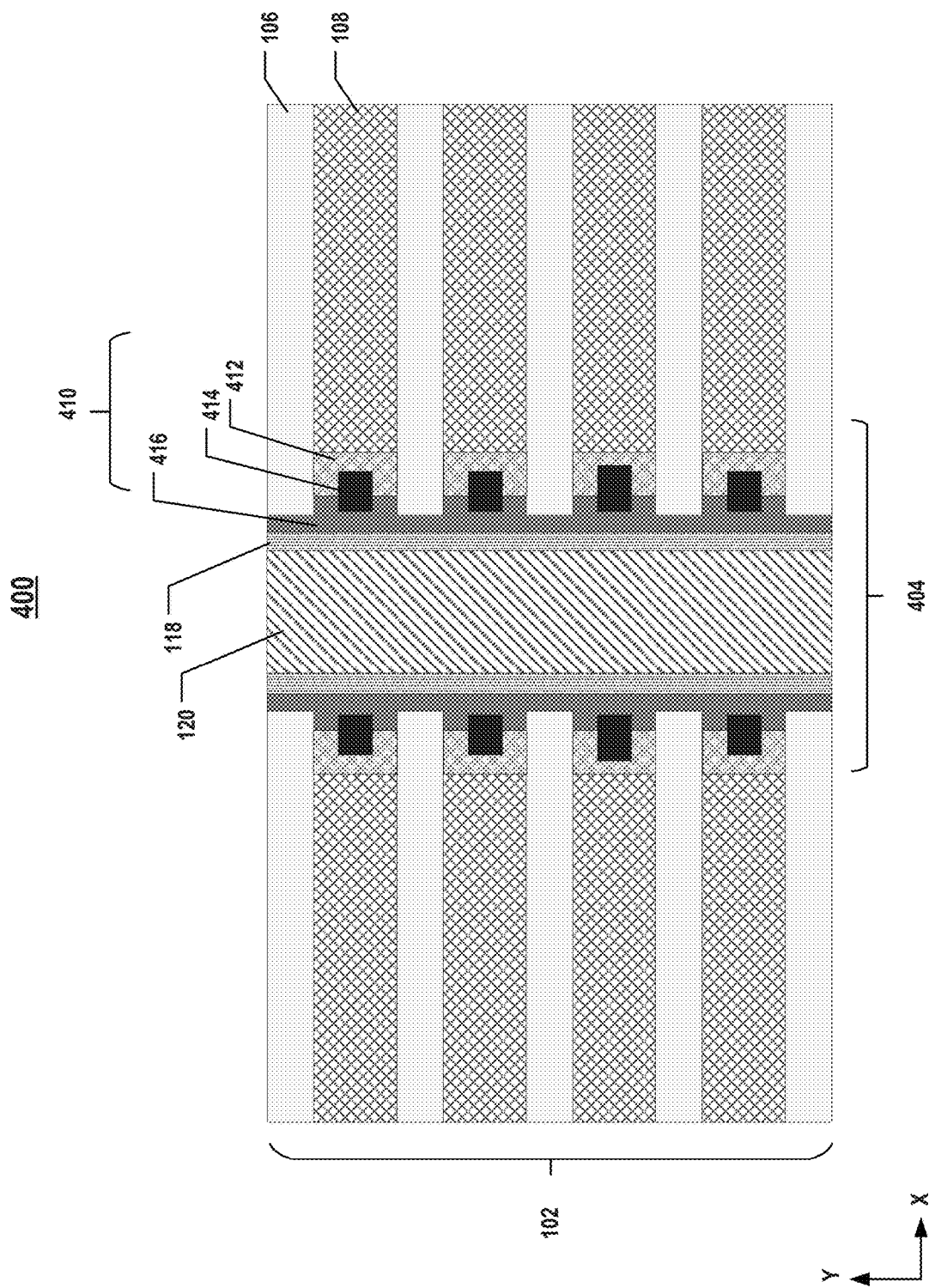
FIG. 4 illustrates a cross-section of yet another exemplary 3D memory device, according to some aspects of the present disclosure.

FIG. 4 illustrates a cross-section of yet another exemplary 3D memory device 400, according to some aspects of the present disclosure. 3D memory device 400 includes stack structure 102 and a channel structure 404. In some implementations, stack structure 102 of 3D memory device 400 may be similar to stack structure 102 of 3D memory device 100, 200, or 300. Channel structure 404 extends through stack structure 102 along the y-direction. Channel structure 404 may include semiconductor channel 118, and a memory film 410 formed over semiconductor channel 118. In some implementations, channel structure 404 may also include dielectric core 120 in the center of channel structure 404. In some implementations, semiconductor channel 118 and dielectric core 120 of 3D memory device 400 may be similar to semiconductor channel 118 and dielectric core 120 of 3D memory device 100, 200, or 300.

In some implementations, memory film 410 may include a tunneling layer 416 over semiconductor channel 118, a storage layer 414 over tunneling layer 416, and a blocking layer 412 over storage layer 414. In some implementations, tunneling layer 416 may include silicon oxide, silicon oxynitride, or any combination thereof. In some implementations, storage layer 414 may include silicon nitride, silicon oxynitride, silicon, or any combination thereof. In some implementations, blocking layer 412 may include silicon oxide, silicon oxynitride, high dielectric constant (high-k) dielectrics, or any combination thereof.

As shown in FIG. 4, storage layer 414 is surrounded by tunneling layer 416 and blocking layer 412. Tunneling layer 416 is in contact with semiconductor channel 118, dielectric layers 106, blocking layer 412, and storage layer 414. In other words, storage layer 414 is fully surrounded by blocking layer 412 and tunneling layer 416, and blocking layer 412 and tunneling layer 416 are in contact with each other. In some implementations, storage layer 414 may include a plurality of trap layers. In some implementations, one of the plurality of trap layers may function as tunneling layer 416. In some implementations, when storage layer 414 is fully surrounded by blocking layer 412 and tunneling layer 416, the retention of the 3D memory device 400 may be further improved.

By dividing blocking layer 412 and storage layer 414 into a plurality of isolated sections along the y-direction, partials of memory film 410 are divided into several inconsecutive sections. The charge stored in storage layer 414 is isolated from other storage layer 314 corresponding to different word lines. In other words, the charge stored in storage layer 414 corresponding to different word lines is isolated from each other. Hence, the charge migration may be restrained in 3D memory device 400.

FIGS. 5-14 illustrate cross-sections of 3D memory device 100 at different stages of a manufacturing process, according to some aspects of the present disclosure. FIG. 15 illustrates a flowchart of an exemplary method 500 for forming 3D memory device 100, according to some aspects of the present disclosure. For the purpose of better describing the present disclosure, the cross-sections of 3D memory device 100 in FIGS. 5-14 and method 500 in FIG. 15 will be discussed together. It is understood that the operations shown in method 500 are not exhaustive and that other operations may be performed as well before, after, or between any of the illustrated operations. Further, some of the operations may be performed simultaneously, or in a different order than shown in FIGS. 5-14 and FIG. 15.

Figure 5:
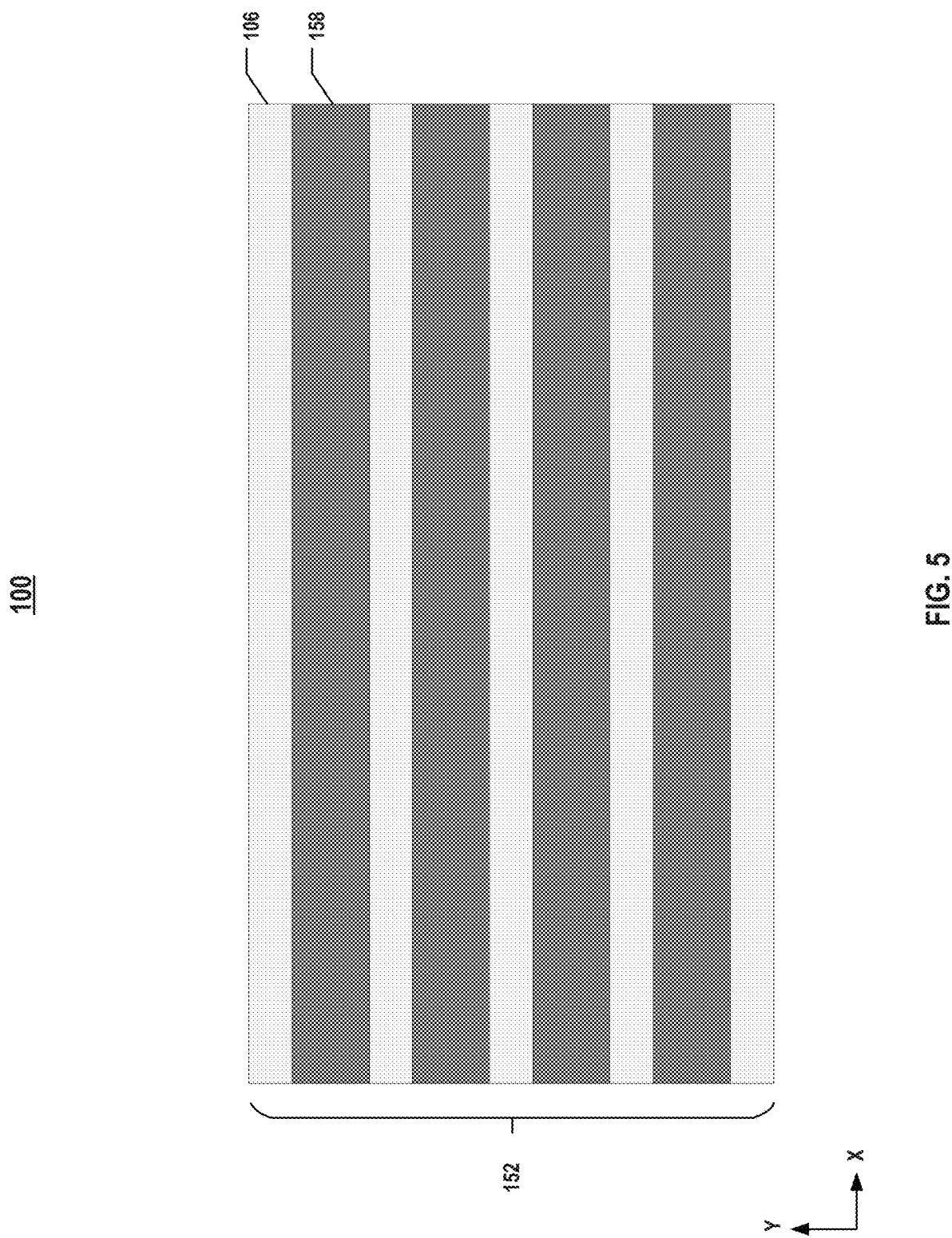
FIGS. 5-14 illustrate cross-sections of an exemplary 3D memory device at different stages of a manufacturing process, according to some aspects of the present disclosure.

As shown in FIG. 5 and operation 502 of FIG. 15, a dielectric stack structure 152 is formed. Dielectric stack structure 152 may include a plurality of dielectric/sacrificial layer pairs. In some implementations, dielectric stack structure 152 may be formed on a substrate (not shown). In some implementations, the substrate may be a doped semiconductor layer. The dielectric/sacrificial layer pairs may include interleaved dielectric layers 106 and sacrificial layers 158 extending along the x-direction. It is understood that, in the present disclosure, the x-direction is the extension direction of the word lines, and the extension direction of the bit lines is a z-direction perpendicular to the x-direction and the −y-direction. In some implementations, each dielectric layer 106 may include a layer of silicon oxide, and each sacrificial layer 158 may include a layer of silicon nitride. Dielectric stack structure 152 may be formed by one or more thin film deposition processes including, but not limited to, chemical vapor deposition (CVD), physical vapor deposition (PVD), atomic layer deposition (ALD), or any combination thereof. In some implementations, a pad oxide layer (not shown) is formed between the substrate and dielectric stack structure 152 by depositing dielectric materials, such as silicon oxide, on the substrate.

Figure 6:
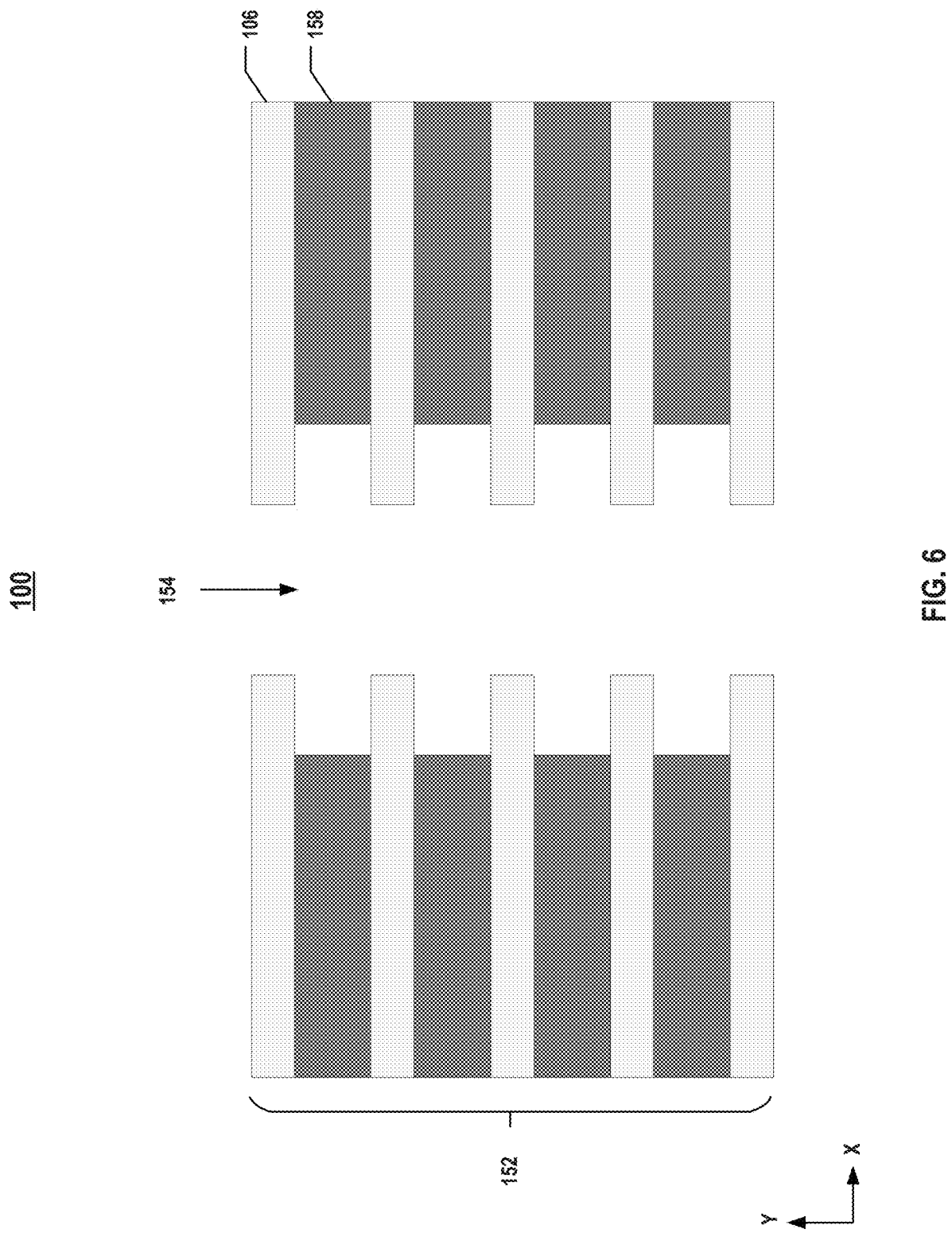

As shown in FIG. 6 and operation 504 of FIG. 15, a channel hole 154 is formed in dielectric stack structure 152 along the y-direction. In some implementations, an etch process may be performed to form channel hole 154 in dielectric stack structure 152 that extends vertically (y-direction) through the interleaved dielectric/sacrificial layers. In some implementations, fabrication processes for forming channel hole 154 may include wet etching and/or dry etching, such as deep reactive ion etching (DRIE). In some implementations, channel hole 154 may extend further into the top portion of the substrate.

In some implementations, because dielectric layers 106 and sacrificial layers 158 may have different removal rates during the etching process, by choosing the etchant of the etching operation, the sidewalls of channel hole 154 may include a recess in each of sacrificial layers 158. For example, when dielectric layers 106 include silicon oxide and sacrificial layers 158 include silicon nitride, an etchant having a higher etching rate to silicon nitride may be used to form the recess. In some implementations, channel hole 154 may be first formed in dielectric stack structure 152 along the y-direction by using a etch operation. Then, another etch operation may be performed to remove portions of sacrificial layers 158 to form the recess.

Figure 7:
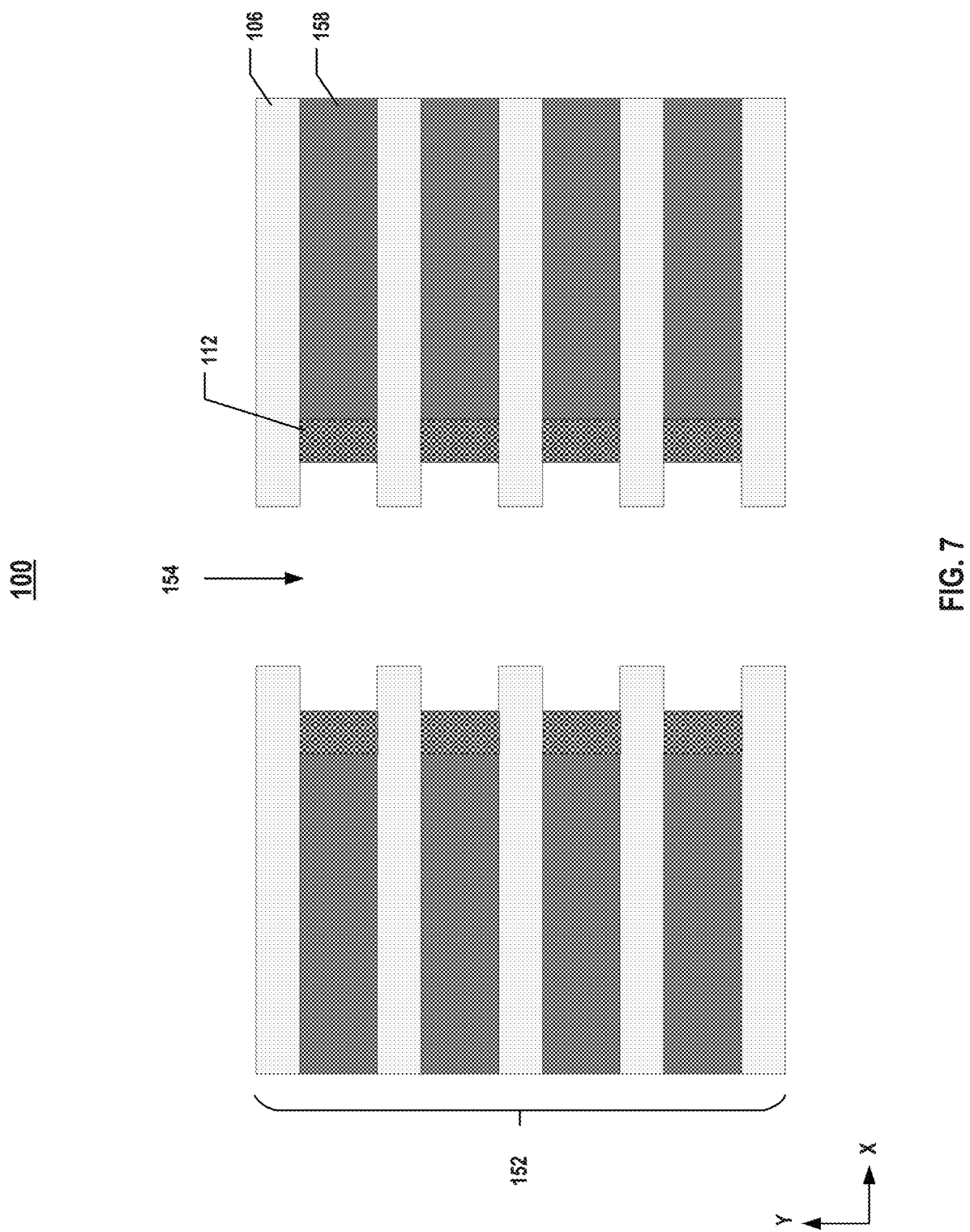

As shown in FIG. 7 and operation 506 of FIG. 15, blocking layer 112 is formed on the sidewalls of channel hole 154 on sacrificial layers 158. In some implementations, blocking layer 112 may include silicon oxide, silicon oxynitride, high dielectric constant (high-k) dielectrics, or any combination thereof. In some implementations, blocking layer 112 may be formed by a deposition operation. In some implementations, blocking layer 112 may be formed by an oxidation operation to oxidate a portion of sacrificial layers 158 into silicon oxide, silicon oxynitride, or other suitable materials. By using the oxidation operation on sacrificial layers 158 to form blocking layer 112, blocking layer 112 can be directly formed on the exposed surface of sacrificial layers 158. Comparing to the process by removing sacrificial layers 158 and depositing blocking layer 112 from a gate line slit, the fabrication process in the present disclosure may be further simplified.

Figure 8:
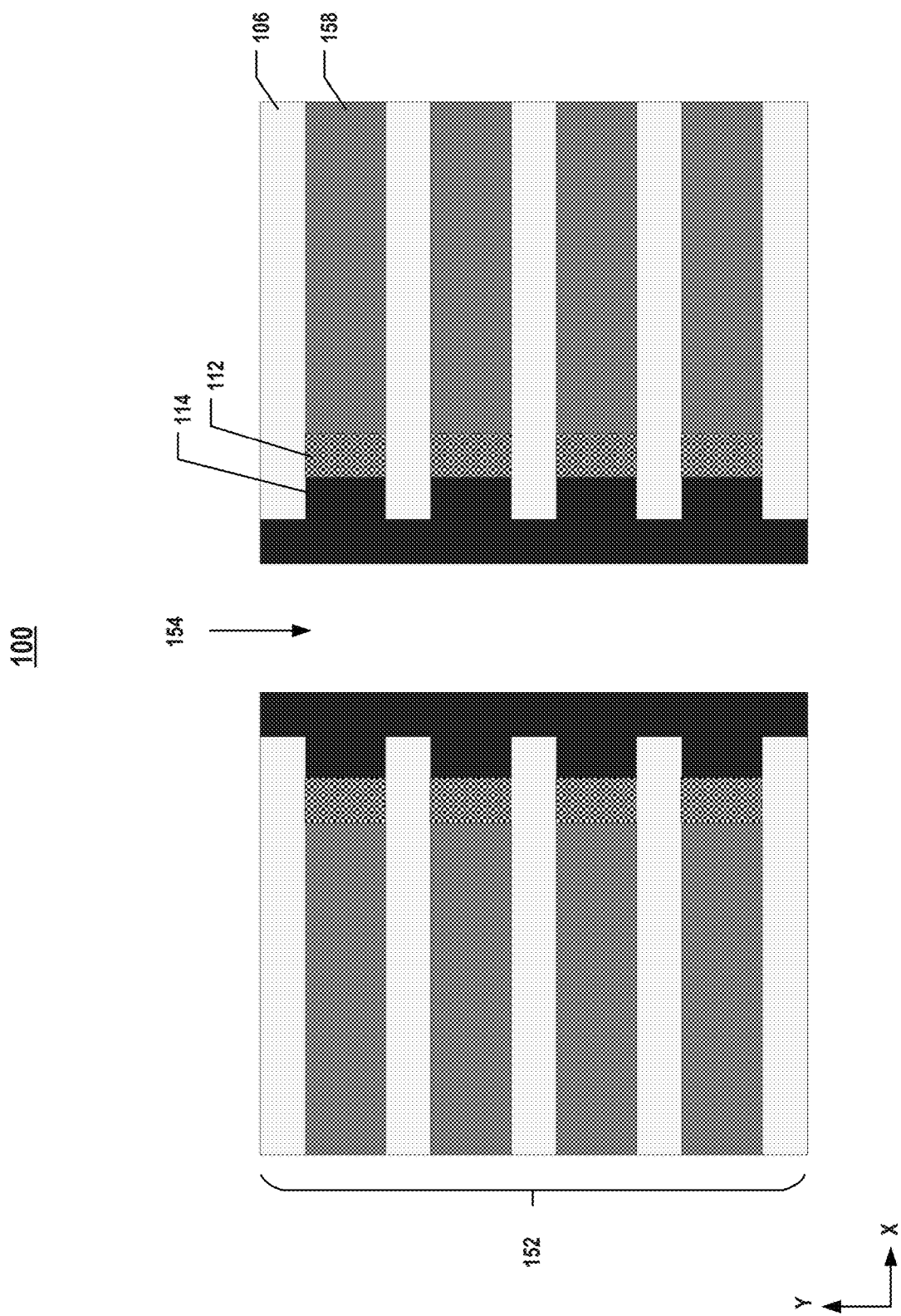
Figure 9:
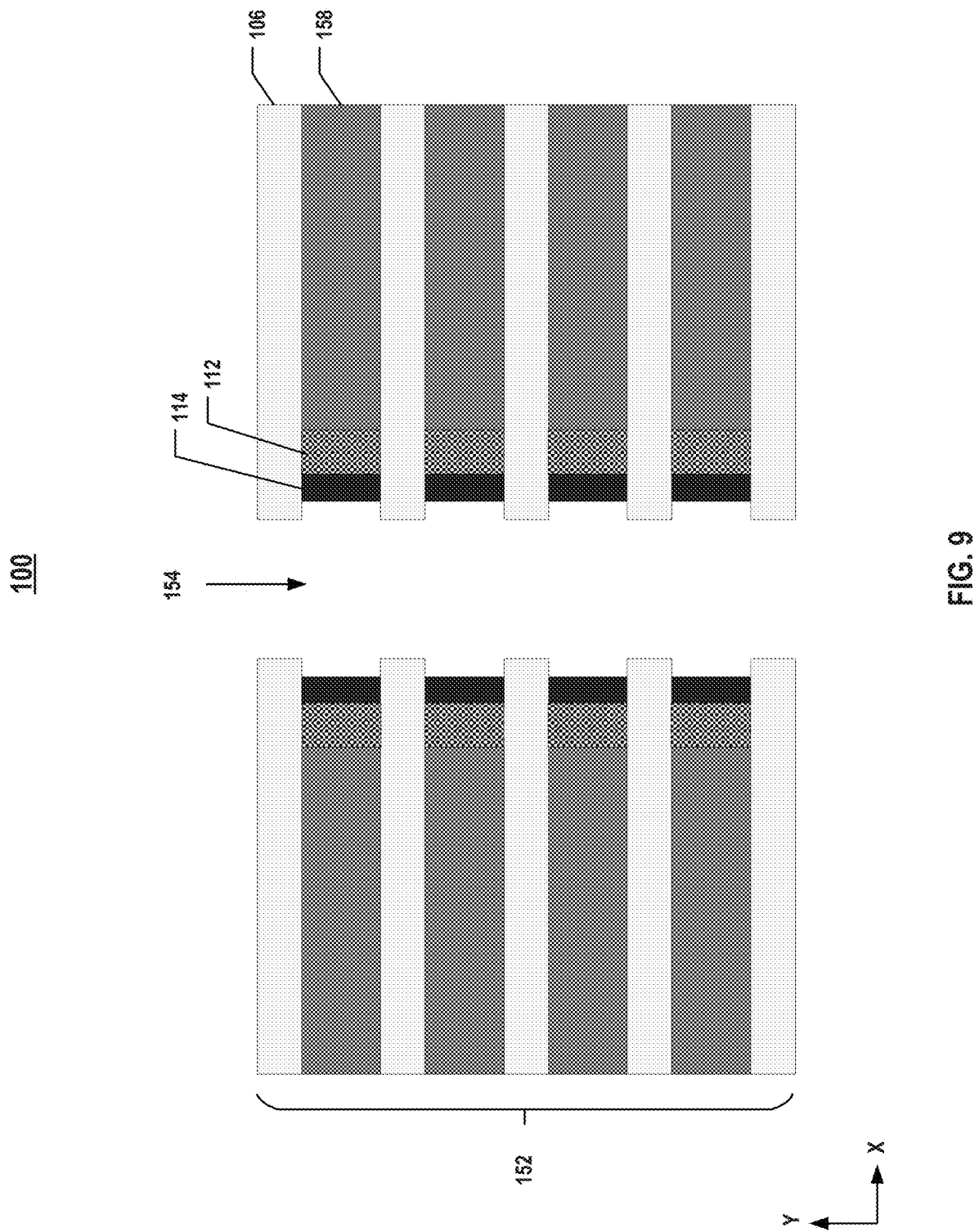

As shown in FIG. 8 and operation 508 of FIG. 15, storage layer 114 may be formed on the sidewalls of channel hole 154 having the recess. Storage layer 114 is formed over blocking layer 112 in the recess and sacrificial layers 158. In some implementations, storage layer 114 is first formed on the sidewalls of channel hole 154 covering dielectric layers 106 and blocking layer 112. In some implementations, storage layer 114 covers the surfaces of blocking layer 112 in the recess and also covers the surfaces of dielectric layers 106. Then, an etch operation may be performed to pull back a portion of storage layer 114, as shown in FIG. 9. In some implementations, the portion of storage layer 114 may be removed by dry etch, wet etch, or other suitable processes. After the pull-back process, storage layer 114 is divided by dielectric layers 106 into a plurality of isolated sections. As shown in FIG. 9, storage layer 114 and blocking layer 112 are not overlapped along the y-direction, and storage layer 114 is in direct contact with blocking layer 112. In some implementations, a top surface and a bottom surface of blocking layer 112 are in direct contact with dielectric layers 106, and a top surface and a bottom surface of storage layer 114 are in direct contact with dielectric layers 106 as well.

In some implementations, storage layer 114 is deposited in the recess and channel hole 154, including deposited on surfaces of dielectric layers 106 and blocking layer 112. The material of storage layer 114 is then etched back to form a plurality of isolated sections. In some implementations, the material of storage layer 114 may be partially oxidized. The amount of oxidation is controlled, for example, by controlling the oxidation process time, and therefore the material of storage layer 114 located outside the recess may be oxidized. The oxidized portion of the material may be removed by an etch operation, for example, a wet etch process, to form a plurality of isolated sections. In some implementations, the location of etch back may be controlled by a high selectivity wet etch or dry etch.

Figure 10:
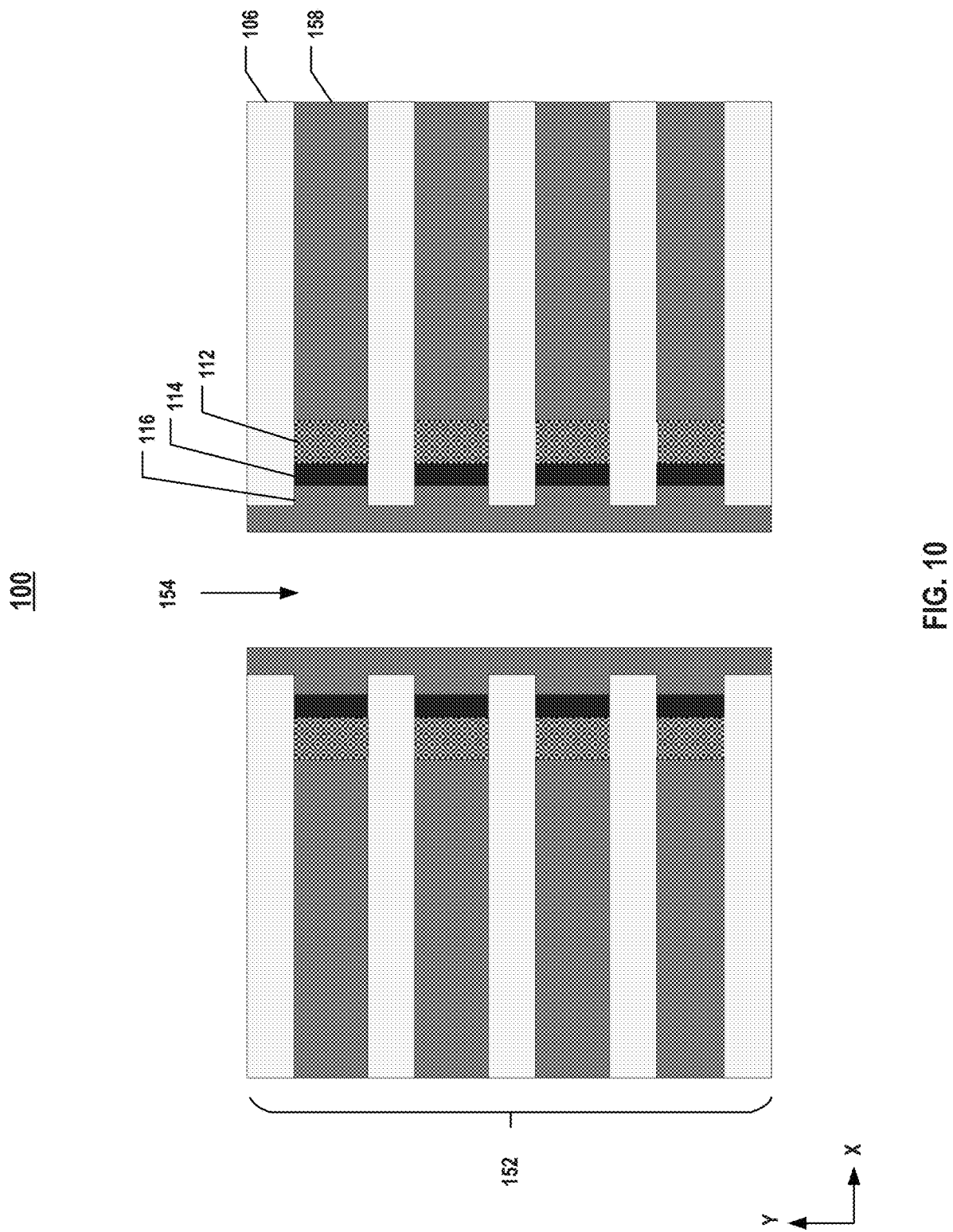

As shown in FIG. 10 and operation 510 of FIG. 15, tunneling layer 116 may be formed over storage layer 114 and dielectric layers 106 on the sidewalls of channel hole 154. In some implementations, storage layer 114 may include a first trap layer and a second trap layer arranged along the x-direction. In some implementations, the first trap layer is in direct contact with blocking layer 112 and is an inconsecutive structure separated by dielectric layers 106. In some implementations, the second trap layer is in direct contact with the first trap layer and may protect the first trap layer. In some implementations, the second trap layer is an inconsecutive structure separated by dielectric layers 106. In some implementations, the second trap layer is a consecutive structure and may be partially separated by dielectric layers 106. In some implementations, tunneling layer 116 may be formed over the second trap layer. In some implementations, the second trap layer may function as a tunneling layer, and the formation of tunneling layer 116 may be omitted. In some implementations, the first trap layer and the second trap layer may be silicon nitride with different Si and N ratios. In some implementations, the first trap layer may have higher Si ratio in silicon nitride and is disposed in contact with blocking layer 112. In this situation, the first trap layer may have a higher conductivity and a smaller refractive index, comparing to the second trap layer. In some implementations, the second trap layer may have higher N ratio in silicon nitride and is disposed in contact with tunneling layer 116. In this situation, the second trap layer may have a higher insulativity and a higher refractive index, comparing to the first trap layer.

Figure 11:
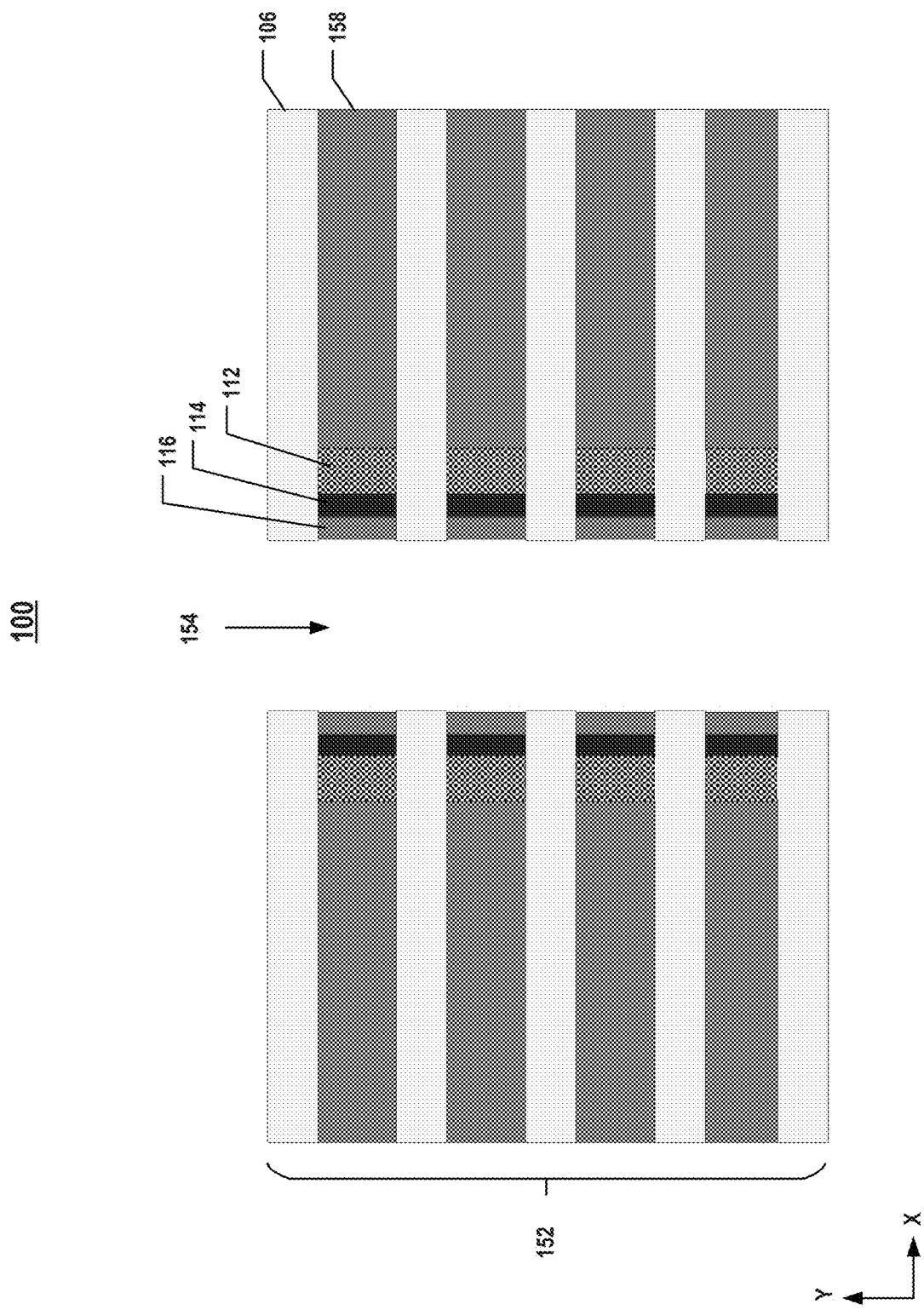

In some implementations, tunneling layer 116 may further be thinned by performing an etch operation. In some implementations, tunneling layer 116 may further be thinned until tunneling layer 116 is fully isolated by dielectric layers 106, as shown in FIG. 11. In some implementations, tunneling layer 116 may not be fully isolated by dielectric layers 106 after the thinning operation and form a structure similar to tunneling layer 216 shown in FIG. 2. In some implementations, tunneling layer 116 may be disposed along y-direction and form a structure similar to tunneling layer 316 shown in FIG. 3.

Figure 12:
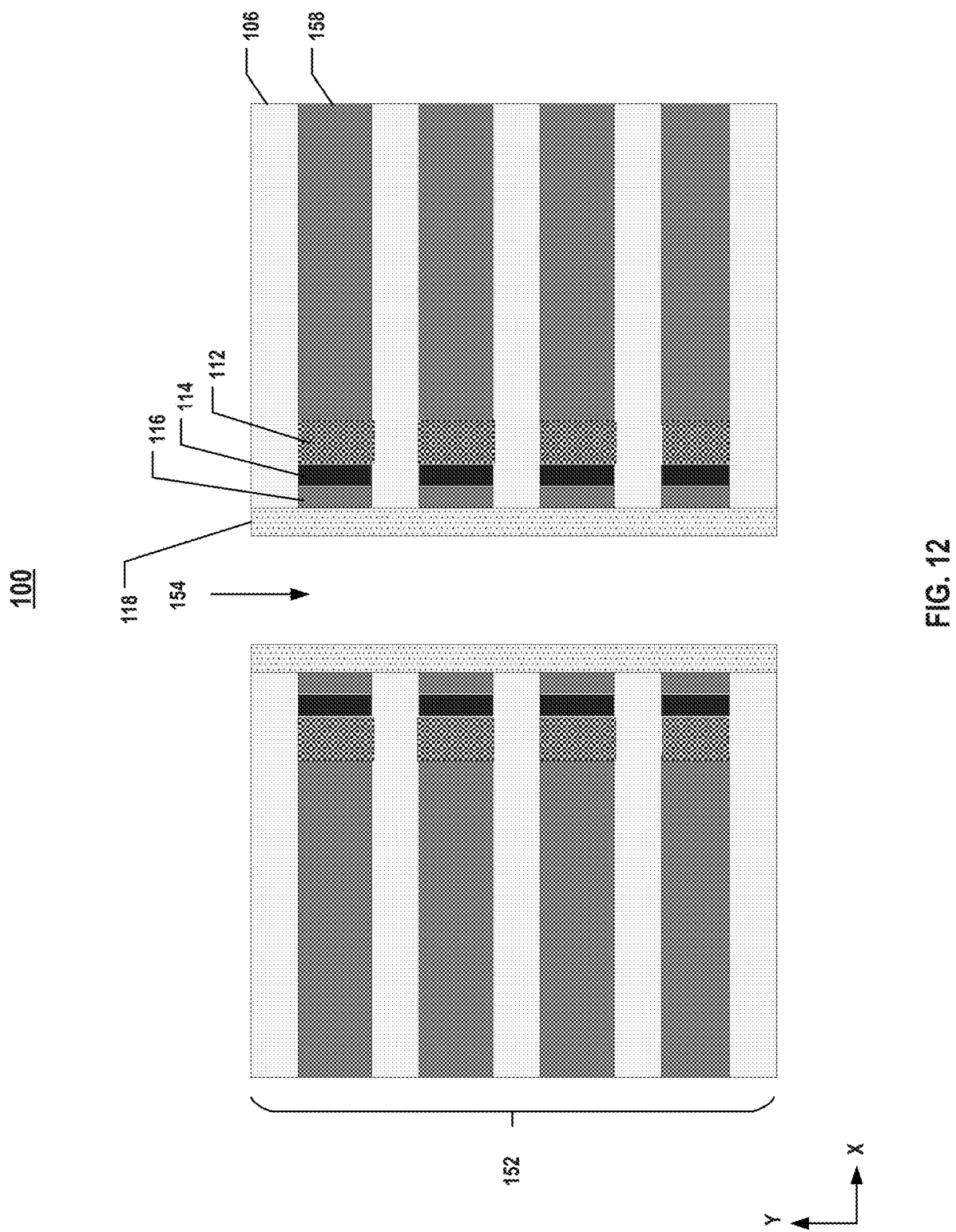
Figure 13:
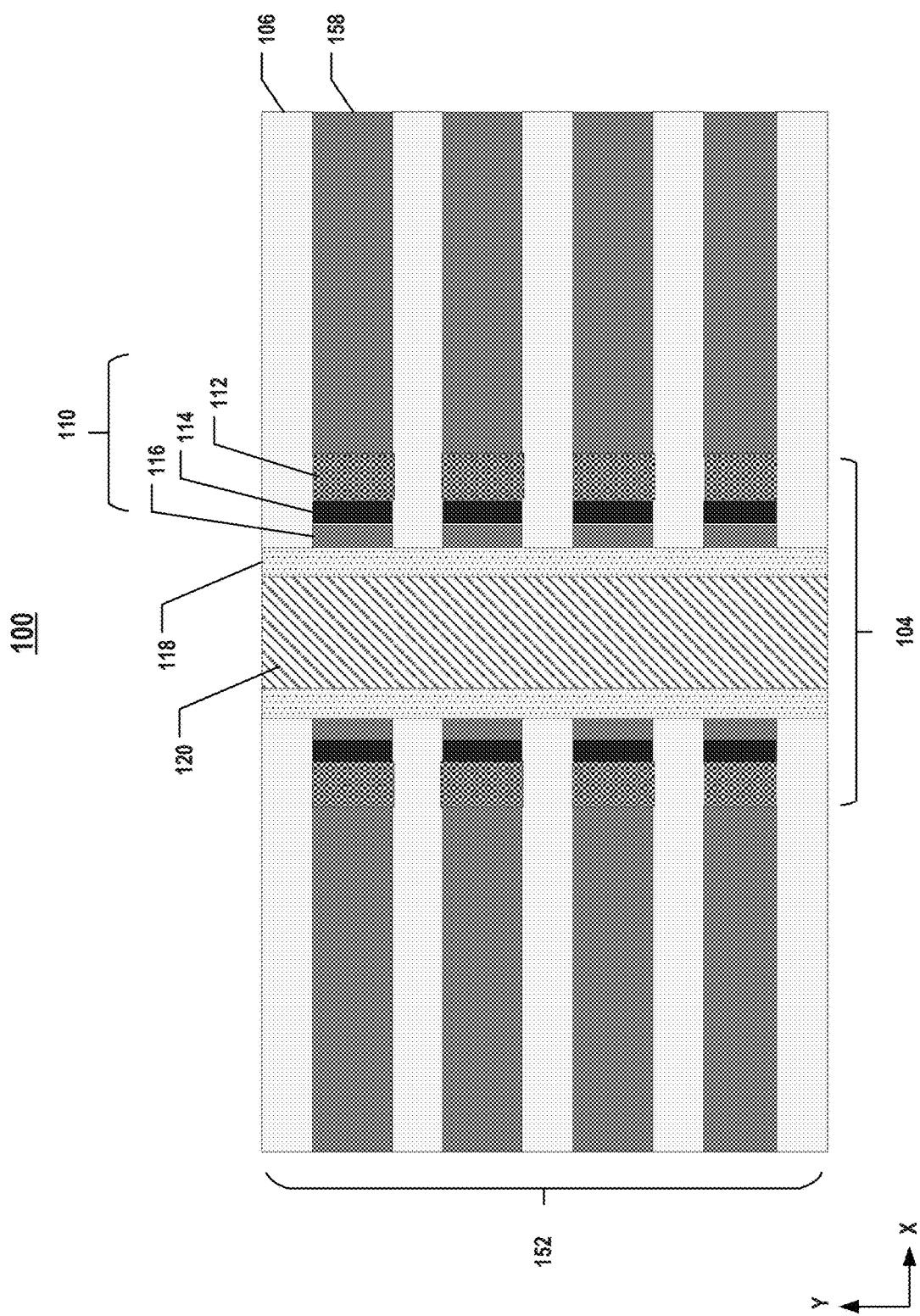

As shown in FIG. 12 and operation 512 of FIG. 15, semiconductor channel 118 may be formed over tunneling layer 116. In some embodiments, semiconductor channel 118 may include silicon, such as amorphous silicon, polysilicon, or single crystalline silicon. In some implementations, semiconductor channel 118 may be in direct contact with dielectric layers 106. In some implementations, dielectric core 120 may be filled in channel hole 154, as shown in FIG. 13.

Figure 14:
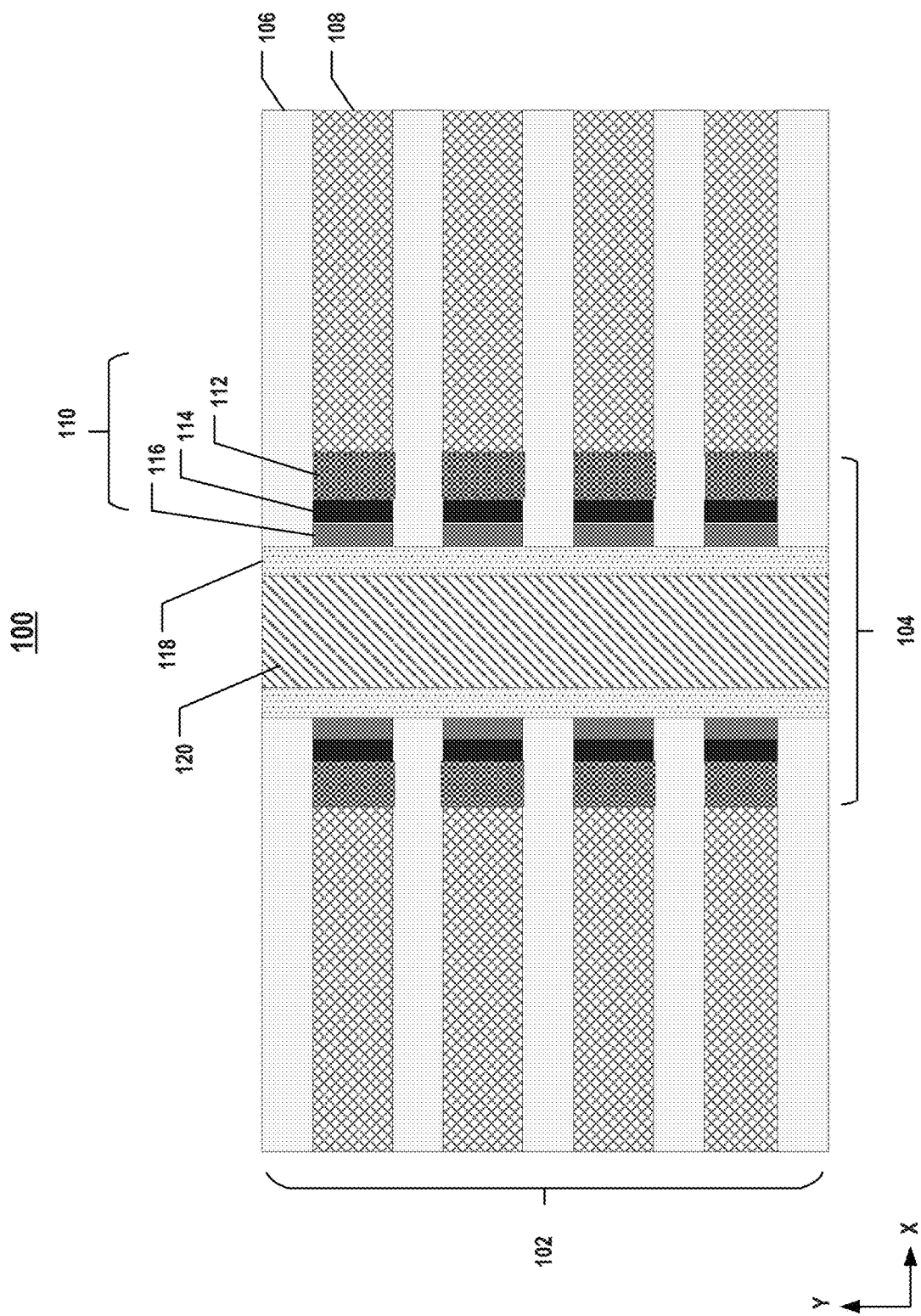
Figure 15:
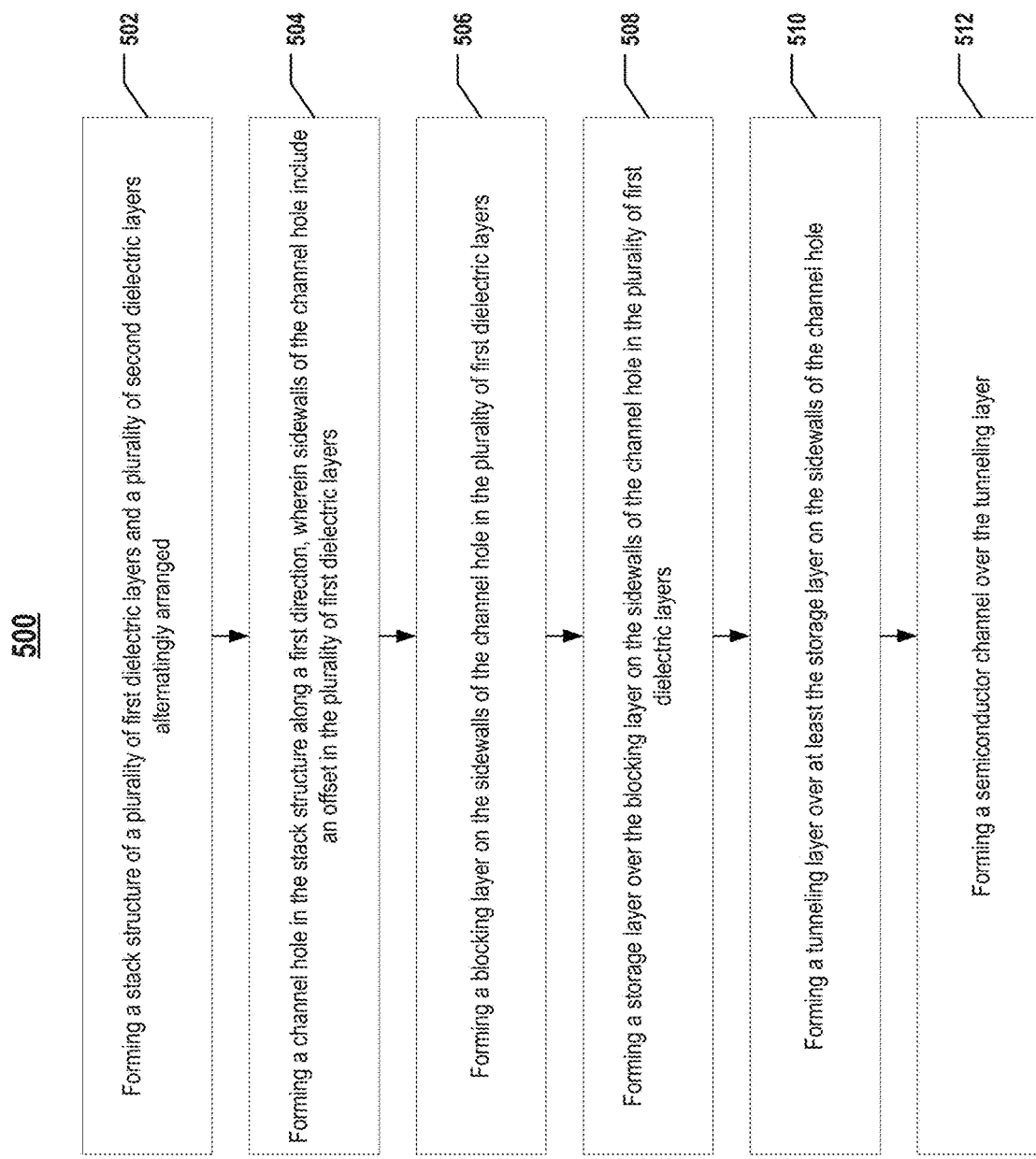
FIG. 15 illustrates a flowchart of an exemplary method for forming a 3D memory device, according to some aspects of the present disclosure.

Then, sacrificial layers 158 may be removed and replaced by the word lines, as shown in FIG. 14. For example, sacrificial layers 158 may be removed by dry etch, wet etch, or other suitable processes to form a plurality of cavities. The word lines (conductive layers 108) may be formed in the cavities by depositing the gate conductor, and the gate conductor may be made from tungsten. In some implementations, the cavities may be filled with the gate dielectric layer made from high-k dielectric materials, the adhesion layer including titanium/titanium nitride (Ti/TiN) or tantalum/tantalum nitride (Ta/TaN.

By dividing blocking layer 112, storage layer 114, and tunneling layer 116 into a plurality of isolated sections along the y-direction, partials of memory film 110 are divided into several inconsecutive sections by using method 500. The charge stored in storage layer 114 is isolated from other storage layer 114 corresponding to different word lines. In other words, the charge stored in storage layer 114 corresponding to different word lines is isolated from each other. Hence, the charge migration may be restrained by using method 500 to form 3D memory device 100. As referred to herein, memory film 110 is a multilayer structure and is an element to achieve the storage function in the 3D memory devices. For example, memory film 110 may include a composite layer of silicon oxide/silicon oxynitride/silicon oxide (ONO). The ONO structure may be formed on the surface of the vertical channel and the ONO structure (memory film 110) is also located between the vertical channel and the conductive films, such as word lines. The word lines may serve as a control gate and is electrically or electronically coupled to memory film 110 in response to a bias.

FIGS. 16-22 illustrate cross-sections of 3D memory device 400 at different stages of a manufacturing process, according to some aspects of the present disclosure. FIG. 23 illustrates a flowchart of another exemplary method 600 for forming 3D memory device 400, according to some aspects of the present disclosure. For the purpose of better describing the present disclosure, the cross-sections of 3D memory device 400 in FIGS. 16-22 and method 600 in FIG. 23 will be discussed together. It is understood that the operations shown in method 600 are not exhaustive and that other operations may be performed as well before, after, or between any of the illustrated operations. Further, some of the operations may be performed simultaneously, or in a different order than shown in FIGS. 16-22 and FIG. 23.

Figure 16:
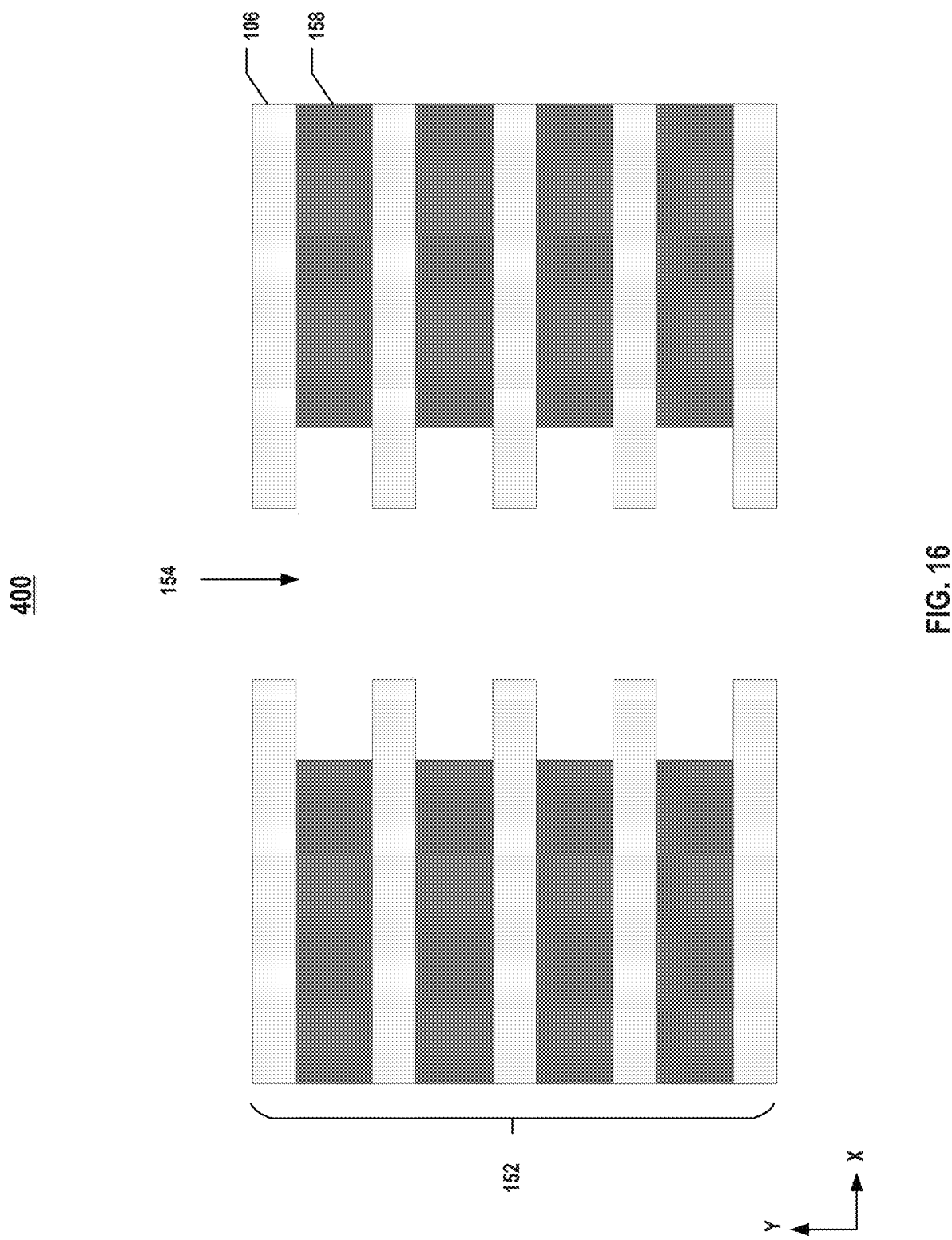
FIGS. 16-22 illustrate cross-sections of another exemplary 3D memory device at different stages of a manufacturing process, according to some aspects of the present disclosure.

As shown in FIG. 16 and operation 602 and operation 604 of FIG. 23, dielectric stack structure 152, including interleaved dielectric layers 106 and sacrificial layers 158, is formed, and channel hole 154 is formed in dielectric stack structure 152 along the y-direction. The sidewalls of channel hole 154 may include a recess in each of sacrificial layers 158. The recess is formed by removing portions sacrificial layers 158 between two dielectric layers 106. In some implementations, the materials of dielectric stack structure 152 and the processes forming channel hole 154 may be similar to operations 502 and 504 of method 500.

Figure 17:
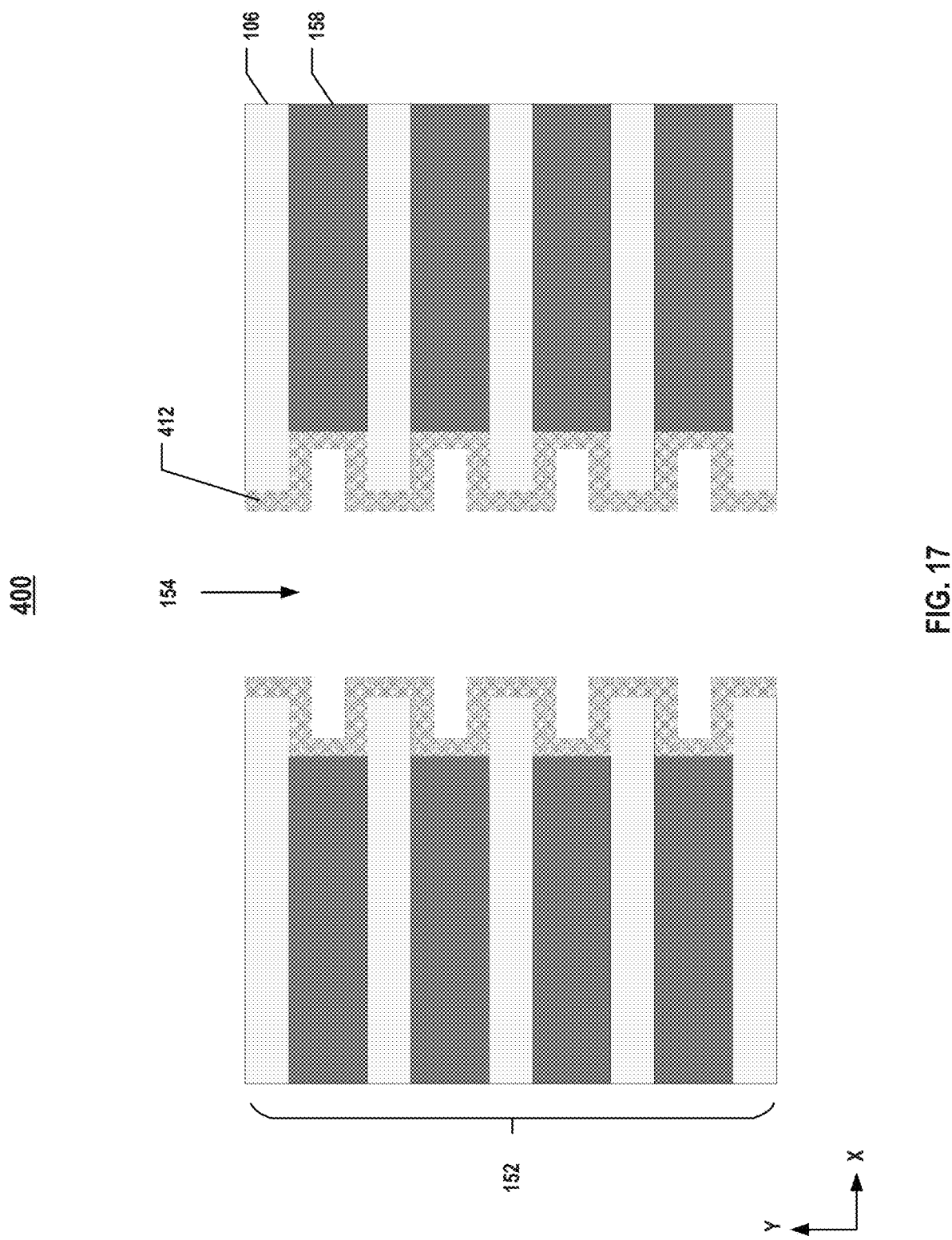
Figure 18:
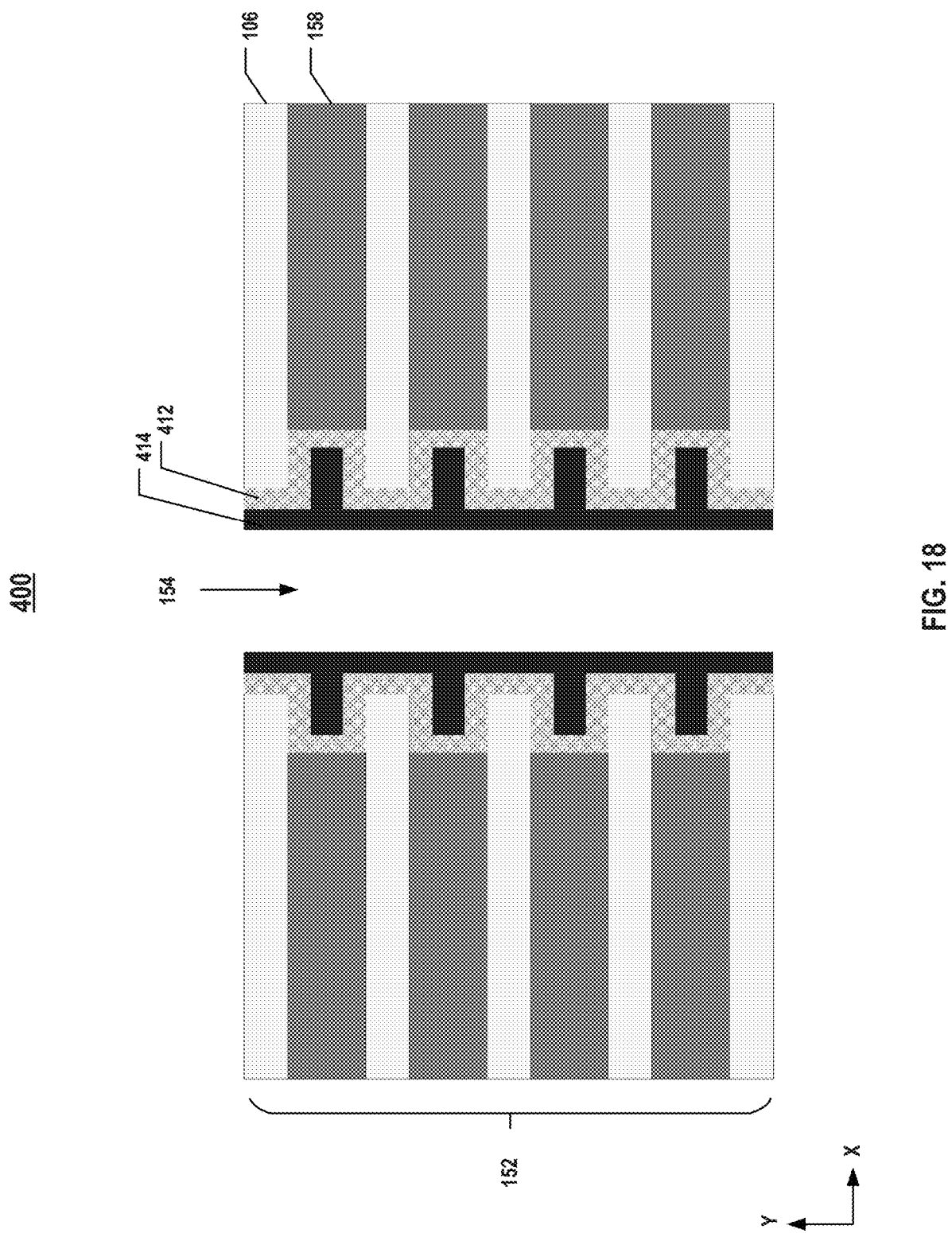

As shown in FIG. 17 and operation 606 of FIG. 23, blocking layer 412 may be conformally formed on the sidewalls of channel hole 154 covering dielectric layers 106 and sacrificial layers 158. In some implementations, the conformal deposition process may include forming a layer that is relatively uniform in thickness over the surface being deposited. Then, as shown in FIG. 18 and operation 608 of FIG. 23, storage layer 414 may be formed over blocking layer 412.

Figure 19:
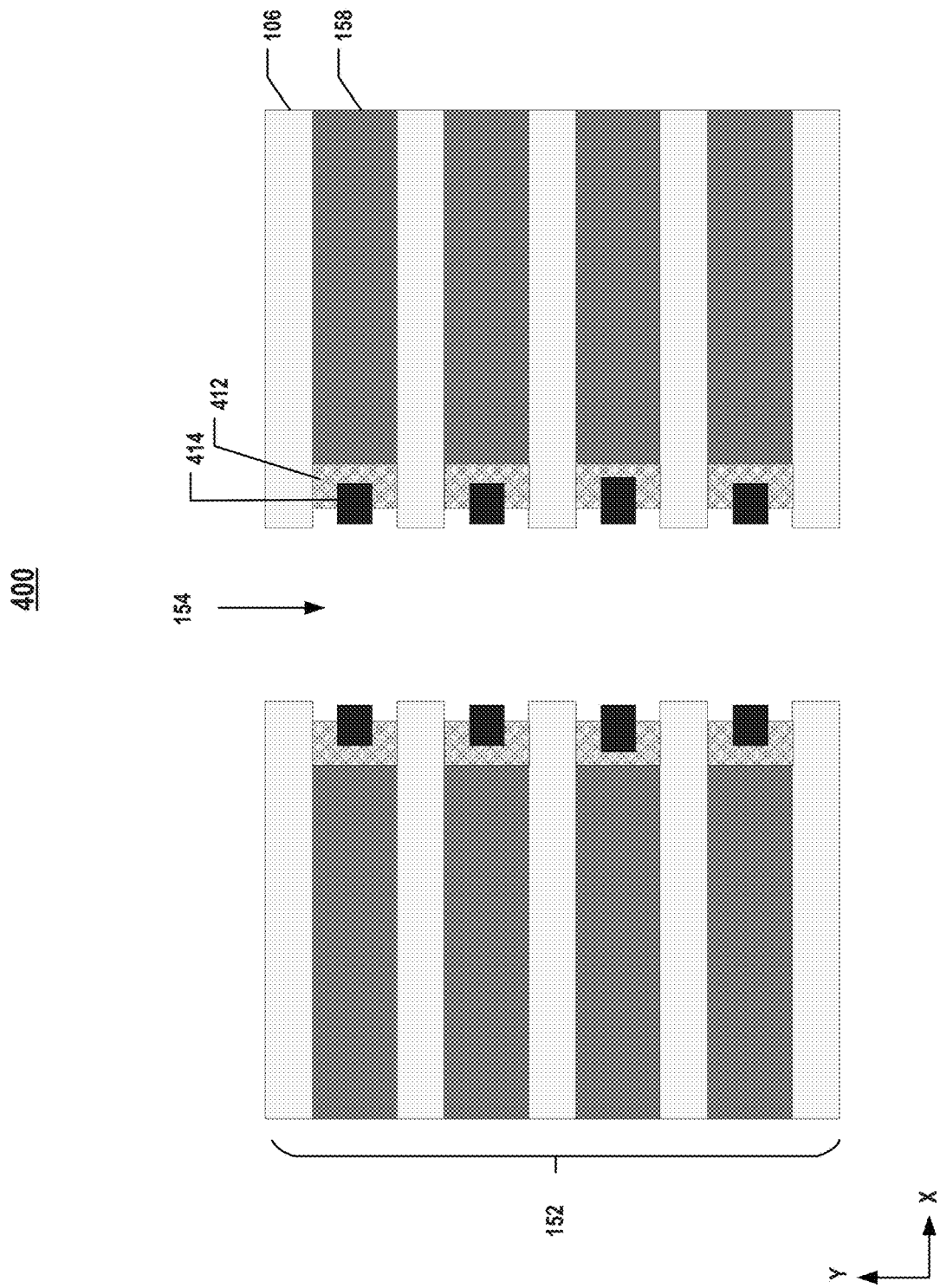

As shown in FIG. 19 and operation 610 of FIG. 23, an etch operation may be performed to remove a portion of storage layer 414 and a portion of blocking layer 412 to expose dielectric layers 106. In some implementations, after the etch operation, dielectric layers 106, storage layer 414, and blocking layer 412 are all exposed. In some implementations, the etch operation may be performed by dry etch, wet etch, or other suitable processes. In some implementations, after the etch operation, blocking layer 412 has a recess along the x-direction in the channel hole 154. In some implementations, after the etch operation, a portion of blocking layer 412 and a portion of storage layer 414 are overlapped along the y-direction. In some implementations, after the etch operation, another portion of storage layer 414 does not overlap with blocking layer 412 along the y-direction.

Figure 20:
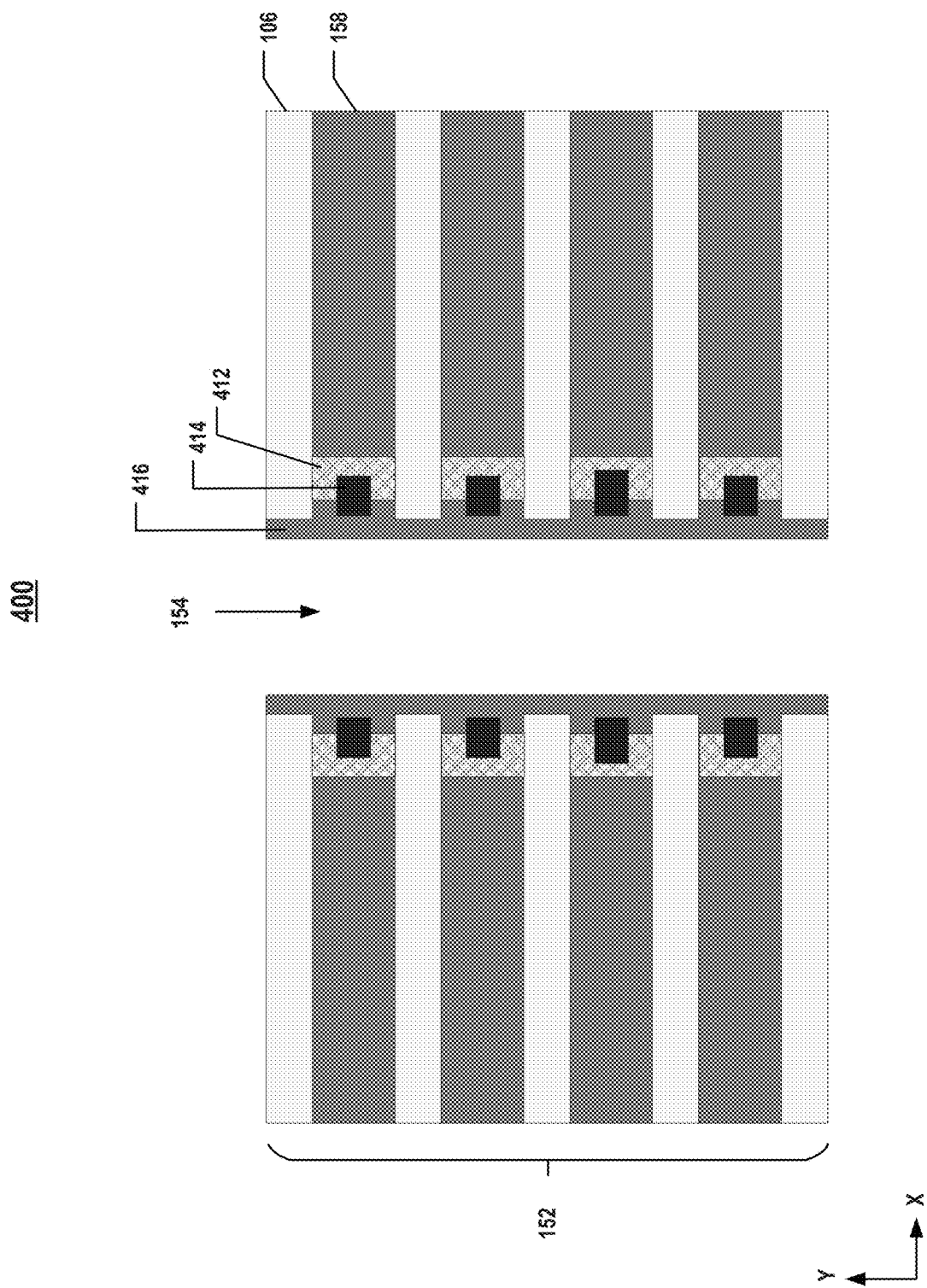

As shown in FIG. 20 and operation 612 of FIG. 23, tunneling layer 416 may be formed over the sidewalls of channel hole 154. In some implementations, since dielectric layers 106, storage layer 414, and blocking layer 412 are all exposed after operation 610, tunneling layer 416 may cover dielectric layers 106, storage layer 414, and blocking layer 412 in operation 612. In other words, tunneling layer 416 may be in direct contact with dielectric layers 106, storage layer 414, and blocking layer 412. In some implementations, blocking layer 412 has a recess along the x-direction, and a portion of tunneling layer 416 is formed in the recess. In some implementations, a portion of tunneling layer 416 and a portion of storage layer 414 are overlapped along the y-direction. In some implementations, another portion of storage layer 414 does not overlap with tunneling layer 416 along the y-direction.

Figure 21:
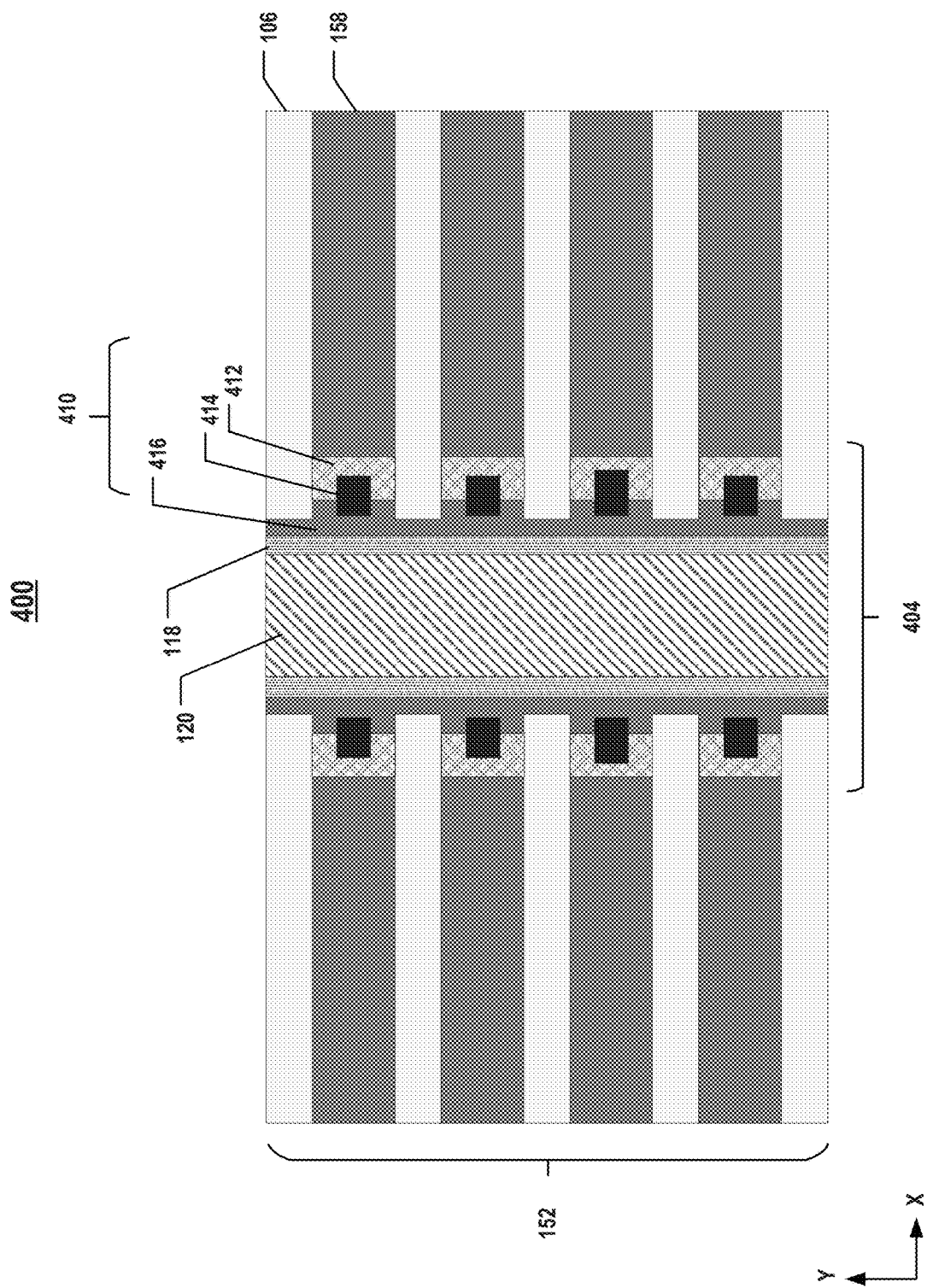

As shown in FIG. 21 and operation 614 of FIG. 23, semiconductor channel 118 may be formed over tunneling layer 416. In some implementations, dielectric core 120 may be filled in channel hole 154, as shown in FIG. 21. In some implementations, the materials and manufacturing processes of semiconductor channel 118 and dielectric core 120 in method 600 may be similar to materials and manufacturing processes of semiconductor channel 118 and dielectric core 120 in method 500.

Figure 22:
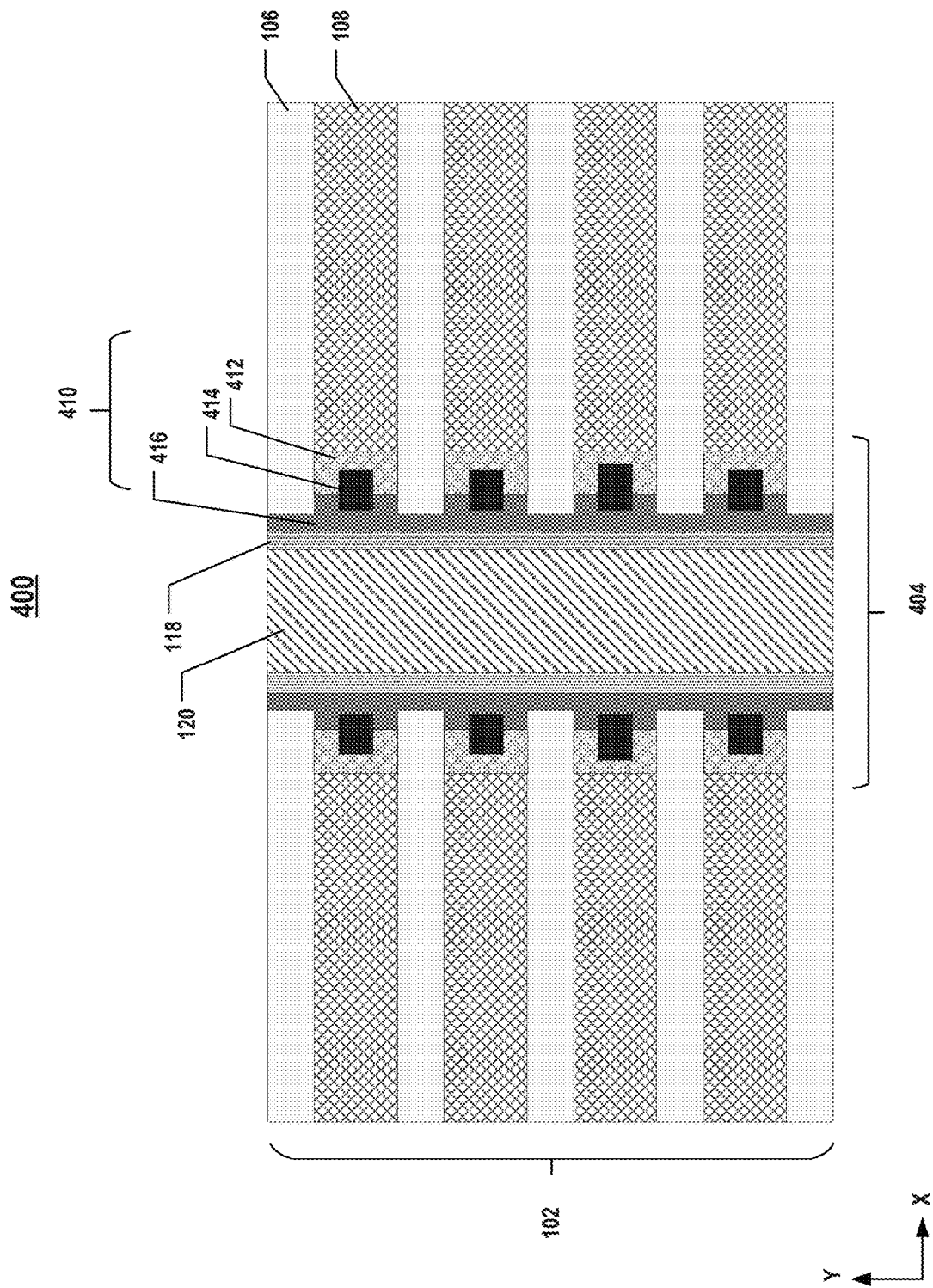
Figure 23:
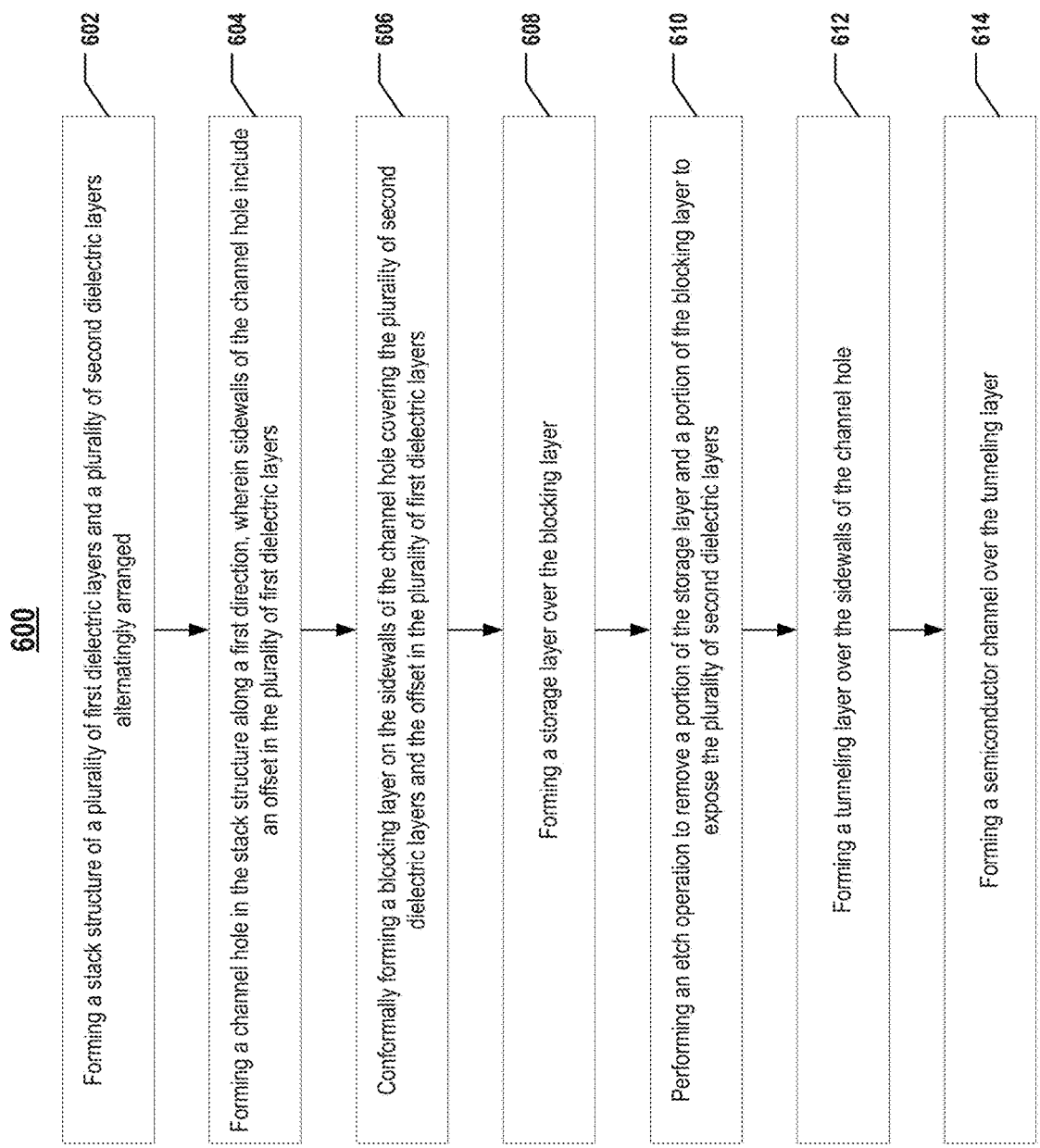
FIG. 23 illustrates a flowchart of another exemplary method for forming a 3D memory device, according to some aspects of the present disclosure.

Then, sacrificial layers 158 may be removed and replaced by the word lines, as shown in FIG. 22. For example, sacrificial layers 158 may be removed by dry etch, wet etch, or other suitable processes to form a plurality of cavities. The word lines (conductive layers 108) may be formed in the cavities by depositing the gate conductor. In some implementations, the cavities may be filled with the gate dielectric layer made from high-k dielectric materials, the adhesion layer including titanium/titanium nitride (Ti/TiN) or tantalum/tantalum nitride (Ta/TaN), and the gate conductor made from tungsten.

By dividing blocking layer 412 and storage layer 414 into a plurality of isolated sections along the y-direction, partials of memory film 410 are divided into several inconsecutive sections by using method 600. The charge stored in storage layer 414 is isolated from other storage layer 314 corresponding to different word lines. In other words, the charge stored in storage layer 414 corresponding to different word lines is isolated from each other. Hence, the charge migration may be restrained by using method 600 to form 3D memory device 400.

Figure 24:
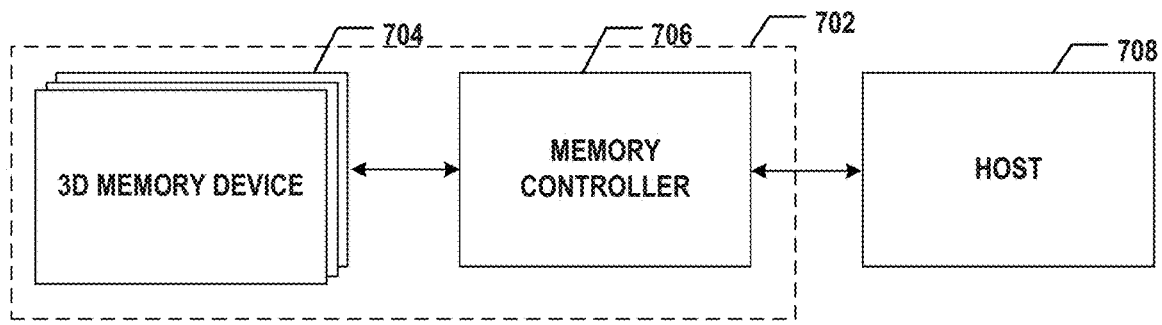
FIG. 24 illustrates a block diagram of an exemplary system having a memory device, according to some aspects of the present disclosure.

FIG. 24 illustrates a block diagram of an exemplary system 700 having a memory device, according to some aspects of the present disclosure. System 700 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 24, system 700 can include a host 708 and a memory system 702 having one or more memory devices 704 and a memory controller 706. Host 708 can be a processor of an electronic device, such as a central processing unit (CPU), or a system-on-chip (SoC), such as an application processor (AP). Host 708 can be configured to send or receive data to or from memory devices 704.

Memory device 704 can be any memory device disclosed in the present disclosure. As disclosed above in detail, memory device 704, such as a NAND Flash memory device, may have a controlled and predefined discharge current in the discharge operation of discharging the bit lines. Memory controller 706 is coupled to memory device 704 and host 708 and is configured to control memory device 704, according to some implementations. Memory controller 706 can manage the data stored in memory device 704 and communicate with host 708. For example, memory controller 706 may be coupled to memory device 704, such as 3D memory device 100 described above, and memory controller 706 may be configured to control the operations of channel structure 104 through the peripheral device. By forming the structure according to the present disclosure, the charge migration of 3D memory device 100 may be further restrained, and the performance of system 700 may be improved as well.

In some implementations, memory controller 706 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 706 is designed for operating in a high duty-cycle environment SSDs or embedded multi-media-cards (eMMCs) used as data storage for mobile devices, such as smartphones, tablets, laptop computers, etc., and enterprise storage arrays. Memory controller 706 can be configured to control operations of memory device 704, such as read, erase, and program operations. Memory controller 706 can also be configured to manage various functions with respect to the data stored or to be stored in memory device 704 including, but not limited to bad-block management, garbage collection, logical-to-physical address conversion, wear leveling, etc. In some implementations, memory controller 706 is further configured to process error correction codes (ECCs) with respect to the data read from or written to memory device 704. Any other suitable functions may be performed by memory controller 706 as well, for example, formatting memory device 704. Memory controller 706 can communicate with an external device (e.g., host 708) according to a particular communication protocol. For example, memory controller 706 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 25A, 25B:
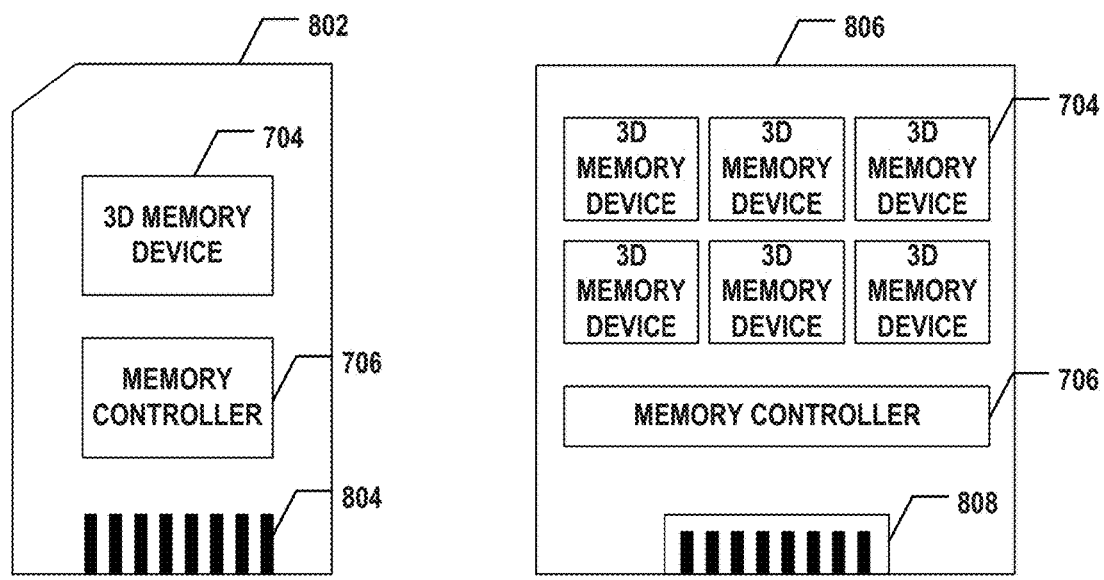
FIG. 25A illustrates a diagram of an exemplary memory card having a memory device, according to some aspects of the present disclosure.
FIG. 25B illustrates a diagram of an exemplary solid-state drive (SSD) having a memory device, according to some aspects of the present disclosure.

Memory controller 706 and one or more memory devices 704 can be integrated into various types of storage devices, for example, be included in the same package, such as a universal Flash storage (UFS) package or an eMMC package. That is, memory system 702 can be implemented and packaged into different types of end electronic products. In one example as shown in FIG. 25A, memory controller 706 and a single memory device 704 may be integrated into a memory card 802. Memory card 802 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 802 can further include a memory card connector 804 coupling memory card 802 with a host (e.g., host 708 in FIG. 24). In another example as shown in FIG. 25B, memory controller 706 and multiple memory devices 704 may be integrated into an SSD 806. SSD 806 can further include an SSD connector 808 coupling SSD 806 with a host (e.g., host 708 in FIG. 24). In some implementations, the storage capacity and/or the operation speed of SSD 806 is greater than those of memory card 802.

According to one aspect of the present disclosure, a 3D memory device is disclosed. The 3D memory device includes a stack structure and a channel structure. The stack structure includes interleaved conductive layers and dielectric layers. The channel structure extends through the stack structure along a first direction. The channel structure includes a semiconductor channel, and a memory film over the semiconductor channel. The memory film includes a tunneling layer over the semiconductor channel, a storage layer over the tunneling layer, and a blocking layer over the storage layer. The storage layer is separated by the dielectric layers into a plurality of sections.

In some implementations, the blocking layer is separated by the dielectric layers into the plurality of sections. In some implementations, the tunneling layer is separated by the dielectric layers into the plurality of sections. In some implementations, the semiconductor channel is in contact with the tunneling layer and the dielectric layers.

In some implementations, the blocking layer, the storage layer, and the tunneling layer are fully separated by the dielectric layers into the plurality of sections isolated from each other. In some implementations, top surfaces of the blocking layer, the storage layer, and the tunneling layer and bottom surfaces of the blocking layer, the storage layer, and the tunneling layer in each section are in direct contact with the dielectric layers. In some implementations, the tunneling layer is in contact with the storage layer, the semiconductor channel, and the dielectric layers.

In some implementations, the tunneling layer comprises a first portion disposed between two adjacent dielectric layers, and a second portion physically extended along the first direction across the dielectric layers. In some implementations, the first portion and the second portion of the tunneling layer are in direct contact with each other. In some implementations, the blocking layer and the storage layer are fully separated by the dielectric layers into the plurality of sections isolated from each other.

In some implementations, the storage layer comprises a plurality of trap layers. In some implementations, the blocking layer and the storage layer are separated by the dielectric layers into the plurality of sections along the first direction. In some implementations, the plurality of sections are stacked along the first direction.

According to another aspect of the present disclosure, a 3D memory device is disclosed. The 3D memory device includes a stack structure and a channel structure. The stack structure includes interleaved conductive layers and dielectric layers. The channel structure extends through the stack structure along a first direction. The channel structure includes a semiconductor channel, and a memory film over the semiconductor channel. The memory film includes a tunneling layer over the semiconductor channel, a storage layer over the tunneling layer, and a blocking layer over the storage layer. The storage layer is separated by the dielectric layers into a plurality of sections. The storage layer and the dielectric layers are separated by the tunneling layer.

In some implementations, the blocking layer is separated by the dielectric layers into the plurality of sections. In some implementations, the tunneling layer is physically extended along the first direction across the dielectric layers. In some implementations, the storage layer and the dielectric layers are separated by the blocking layer.

In some implementations, the tunneling layer is in contact with each separated blocking layer of the plurality of sections of the blocking layer. In some implementations, a portion of the tunneling layer and a portion of the storage layer are overlapped along the first direction. In some implementations, the tunneling layer is in contact with each separated storage layer of the plurality of sections of the storage layer on the first direction and a second direction perpendicular to the first direction. In some implementations, the blocking layer and the storage layer are separated by the dielectric layers into the plurality of sections along the first direction. In some implementations, the plurality of sections are stacked along the first direction.

According to still another aspect of the present disclosure, a system is disclosed. The system includes a 3D memory device configured to store data and a memory controller. The 3D memory device includes a stack structure and a channel structure. The stack structure includes interleaved conductive layers and dielectric layers. The channel structure extends through the stack structure along a first direction. The channel structure includes a semiconductor channel, and a memory film over the semiconductor channel. The memory film includes a tunneling layer over the semiconductor channel, a storage layer over the tunneling layer, and a blocking layer over the storage layer. The storage layer is separated by the dielectric layers into a plurality of sections. The memory controller is coupled to the 3D memory device and is configured to control operations of the 3D memory device.

According to yet another aspect of the present disclosure, a system is disclosed. The system includes a 3D memory device configured to store data and a memory controller. The 3D memory device includes a stack structure and a channel structure. The stack structure includes interleaved conductive layers and dielectric layers. The channel structure extends through the stack structure along a first direction. The channel structure includes a semiconductor channel, and a memory film over the semiconductor channel. The memory film includes a tunneling layer over the semiconductor channel, a storage layer over the tunneling layer, and a blocking layer over the storage layer. The storage layer is separated by the dielectric layers into a plurality of sections. The storage layer and the dielectric layers are separated by the tunneling layer. The memory controller is coupled to the 3D memory device and is configured to control operations of the 3D memory device.

According to yet another aspect of the present disclosure, a method for forming a 3D memory device is disclosed. A stack structure of a plurality of first dielectric layers and a plurality of second dielectric layers alternatingly arranged is formed. A channel hole is formed in the stack structure along a first direction. The sidewalls of the channel hole include a recess in the plurality of first dielectric layers. A blocking layer is formed on the recess of the channel hole in the plurality of first dielectric layers. A storage layer is formed over the blocking layer on the recess of the channel hole in the plurality of first dielectric layers. The storage layer in each first dielectric layer is separated by the second dielectric layers. A tunneling layer is formed over at least the storage layer on the sidewalls of the channel hole. A semiconductor channel is formed over the tunneling layer.

In some implementations, an oxidation operation is performed on the plurality of first dielectric layers to form the blocking layer. In some implementations, the plurality of first dielectric layers are oxidized from the channel hole. In some implementations, the storage layer is formed over the recess of the channel hole, and a first thinning operation is performed to remove a portion of the storage layer on the plurality of second dielectric layers. In some implementations, the portion of the storage layer is removed to have the storage layer separated by the plurality of second dielectric layers.

In some implementations, the storage layer includes a plurality of trap layers. In some implementations, the tunneling layer is formed over the recess of the channel hole covering the storage layer and the plurality of second dielectric layers, and a second thinning operation is performed to remove a portion of the tunneling layer on the plurality of second dielectric layers.

In some implementations, the semiconductor channel is formed over the tunneling layer, and the semiconductor channel is in contact with the plurality of second dielectric layers. In some implementations, the tunneling layer is formed over the recess of the channel hole covering the storage layer and the plurality of second dielectric layers along a second direction perpendicular to the first direction, and a second etch operation is performed to thin the tunneling layer.

In some implementations, the tunneling layer is in contact with the semiconductor channel, the plurality of second dielectric layers, and the storage layer. In some implementations, the plurality of first dielectric layers are removed, and a plurality of word lines are formed between the plurality of second dielectric layers.

According to yet another aspect of the present disclosure, a method for forming a 3D memory device is disclosed. A stack structure of a plurality of first dielectric layers and a plurality of second dielectric layers alternatingly arranged is formed. A channel hole is formed in the stack structure along a first direction. The sidewalls of the channel hole include a recess in the plurality of first dielectric layers. A blocking layer is conformally formed on the recess of the channel hole covering the plurality of second dielectric layers and the recess in the plurality of first dielectric layers. A storage layer is formed over the blocking layer. A thinning operation is performed to remove a portion of the storage layer and a portion of the blocking layer to expose the plurality of second dielectric layers. The storage layer in each first dielectric layer is separated by the second dielectric layers. A tunneling layer is formed over the sidewalls of the channel hole. A semiconductor channel is formed over the tunneling layer.

In some implementations, a deposition operation is performed to form the blocking layer on the recess of the channel hole, and the blocking layer conformally covers the plurality of second dielectric layers and the recess in the plurality of first dielectric layers.

In some implementations, the thinning operation is performed to expose the plurality of second dielectric layers and the blocking layer. In some implementations, the tunneling layer is formed over the blocking layer, the storage layer, and the plurality of second dielectric layers.

In some implementations, the tunneling layer is in contact with the blocking layer. In some implementations, the tunneling layer is in contact with the plurality of second dielectric layers. In some implementations, the plurality of first dielectric layers are removed, and a plurality of word lines are formed between the plurality of second dielectric layers.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a stack structure comprising interleaved conductive layers and dielectric layers; and
a channel structure extending through the stack structure along a first direction, the channel structure comprising a semiconductor channel, and a memory film over the semiconductor channel, and the memory film comprising a tunneling layer over the semiconductor channel, a storage layer over the tunneling layer, and a blocking layer over the storage layer,
wherein the storage layer is separated by the dielectric layers into a plurality of storage sections each in contact with corresponding adjacent dielectric layers, and
wherein the blocking layer, the storage layer, and the tunneling layer are fully separated by the dielectric layers into a plurality of sections isolated from each other.

2. The 3D memory device of claim 1, wherein top surfaces of the blocking layer, the storage layer, and the tunneling layer and bottom surfaces of the blocking layer, the storage layer, and the tunneling layer in each section of the plurality of sections are in direct contact with the dielectric layers.

3. The 3D memory device of claim 1, wherein the tunneling layer is in contact with the storage layer, the semiconductor channel, and the dielectric layers.

4. The 3D memory device of claim 1, wherein the tunneling layer comprises a first portion disposed between two adjacent dielectric layers, and a second portion physically extended along the first direction across the dielectric layers.

5. The 3D memory device of claim 1, wherein the storage layer comprises a plurality of trap layers.

6. The 3D memory device of claim 1, wherein the plurality of storage sections are stacked along the first direction.

7. A three-dimensional (3D) memory device, comprising:
a stack structure comprising interleaved conductive layers and dielectric layers; and
a channel structure extending through the stack structure along a first direction, the channel structure comprising a semiconductor channel, and a memory film over the semiconductor channel, and the memory film comprising a tunneling layer over the semiconductor channel, a storage layer over the tunneling layer, and a blocking layer over the storage layer,
wherein the storage layer is separated by the dielectric layers into a plurality of storage sections, and
wherein the storage layer and the dielectric layers are physically separated by the tunneling layer.

8. The 3D memory device of claim 7, wherein the blocking layer is separated by the dielectric layers into a plurality of blocking sections.

9. The 3D memory device of claim 8, wherein the tunneling layer is in contact with each blocking section of the plurality of blocking sections.

10. The 3D memory device of claim 9, wherein a portion of the tunneling layer and a portion of the storage layer are overlapped along the first direction.

11. The 3D memory device of claim 7, wherein the tunneling layer is physically extended along the first direction across the dielectric layers.

12. The 3D memory device of claim 7, wherein the storage layer and the dielectric layers are separated by the blocking layer.

13. The 3D memory device of claim 7, wherein the tunneling layer is in contact with each storage section of the plurality of storage sections on the first direction.

14. A method for forming a three-dimensional (3D) memory device, comprising:
forming a stack structure of a plurality of first dielectric layers and a plurality of second dielectric layers alternatingly arranged;
forming a channel hole in the stack structure along a first direction, wherein a sidewall of the channel hole comprises a recess;
forming a blocking layer in the recess of the channel hole in the plurality of first dielectric layers;
forming a storage layer over the blocking layer in the recess of the channel hole and in contact with the plurality of second dielectric layers, wherein the storage layer in the recess is separated by the plurality of second dielectric layers;

forming a tunneling layer over at least the storage layer on the sidewalls of the channel hole; and forming a semiconductor channel over the tunneling layer.

15. The method of claim 14, wherein forming the blocking layer in the recess of the channel hole in the plurality of first dielectric layers, further comprises:

performing an oxidation operation on the plurality of first dielectric layers to form the blocking layer.

16. The method of claim 14, wherein forming the storage layer over the blocking layer in the recess of the channel hole in the plurality of first dielectric layers, further comprises:

forming the storage layer over the recess of the channel hole; and performing a first thinning operation to remove a portion of the storage layer on the plurality of second dielectric layers.

17. The method of claim 16, wherein removing the portion of the storage layer on the plurality of second dielectric layers, further comprises:

removing the portion of the storage layer to have the storage layer separated by the plurality of second dielectric layers.

18. The method of claim 14, wherein forming the tunneling layer over at least the storage layer in the recess of the channel hole, further comprises:

forming the tunneling layer over the recess of the channel hole covering the storage layer and the plurality of second dielectric layers; and performing a second thinning operation to remove a portion of the tunneling layer on the plurality of second dielectric layers.

19. The method of claim 18, wherein forming the semiconductor channel over the tunneling layer, further comprises:

forming the semiconductor channel over the tunneling layer, wherein the semiconductor channel is in contact with the plurality of second dielectric layers.

* * * * *